US008355419B2

(12) United States Patent (10) Patent No.: US 8,355,419 B2
Shchukin et al. (45) Date of Patent: Jan. 15, 2013

(54) SEMICONDUCTOR OPTOELECTRONIC DEVICE WITH IMPROVED BEAM QUALITY

(75) Inventors: Vitaly Shchukin, Berlin (DE); Nikolai Ledentsov, Berlin (DE)

(73) Assignee: PBC Lasers GmbH, Berlin (DE)

( * ) Notice: Subject to any disclaimer, the term of this patent is extended or adjusted under 35 U.S.C. 154(b) by 0 days.

(21) Appl. No.: 12/627,132

(22) Filed: Nov. 30, 2009

(65) Prior Publication Data

US 2010/0135348 A1 Jun. 3, 2010

Related U.S. Application Data

(60) Provisional application No. 61/118,550, filed on Nov. 28, 2008, provisional application No. 61/245,326, filed on Sep. 24, 2009.

(51) Int. Cl.
*H01S 5/00* (2006.01)
(52) U.S. Cl. ............. 372/45.01; 372/20; 372/43.01; 372/98; 257/97; 257/E33.067
(58) Field of Classification Search ......... 372/20, 372/43.01, 45.01, 98; 257/97, E33.067
See application file for complete search history.

(56) References Cited

U.S. PATENT DOCUMENTS

| | | | |
|---|---|---|---|
| 6,097,742 A | 8/2000 | Caprara et al. | |
| 6,239,901 B1 | 5/2001 | Kaneko | |
| 6,804,280 B2 | 10/2004 | Schukin et al. | |
| 7,031,360 B2 | 4/2006 | Ledentsov et al. | |
| 7,421,001 B2 | 9/2008 | Schukin et al. | |
| 7,580,595 B1 * | 8/2009 | Bimberg et al. | 385/4 |
| 7,583,712 B2 | 9/2009 | Ledentsov et al. | |
| 7,593,436 B2 * | 9/2009 | Ledentsov et al. | 372/20 |
| 7,772,615 B2 * | 8/2010 | Ledentsov et al. | 257/184 |
| 2001/0033590 A1 | 10/2001 | Yuri et al. | |
| 2003/0152120 A1 * | 8/2003 | Ledentsov et al. | 372/45 |
| 2004/0150001 A1 * | 8/2004 | Shchukin et al. | 257/183 |
| 2005/0018743 A1 | 1/2005 | Volodin et al. | |
| 2005/0040410 A1 | 2/2005 | Ledentsov et al. | |
| 2005/0226294 A1 * | 10/2005 | Ledentsov et al. | 372/44.01 |
| 2005/0276296 A1 * | 12/2005 | Ledentsov et al. | 372/42 |
| 2006/0103380 A1 | 5/2006 | Kochergin et al. | |
| 2006/0251134 A1 | 11/2006 | Volodin et al. | |
| 2006/0256832 A1 | 11/2006 | Volodin et al. | |
| 2007/0091953 A1 * | 4/2007 | Ledentsov et al. | 372/43.01 |

(Continued)

OTHER PUBLICATIONS

Novel concepts for injection lasers, Nikolai N. Ledentsov and Vitaly A. Shchukin, Opt. Eng. 41 (12), pp. 3919-3203, Dec. 2002.

(Continued)

*Primary Examiner* — Julio J Maldonado
*Assistant Examiner* — Delma Forde
(74) *Attorney, Agent, or Firm* — KED & Associates LLP

(57) ABSTRACT

A tilted wave semiconductor diode laser containing additional structural elements that improve beam quality is provided. The tilted wave laser includes a narrow active waveguide coupled to a broad passive waveguide, and light generated in the active waveguide leaks to the broad waveguide and propagates in it in the form of a tilted optical wave. The device emits laser light coming out from the broad waveguide in the form of one or two narrow beams. The additional structural elements may include grooves intersecting the narrow waveguide and a stripe that suppress undesired emission from the narrow waveguide; grooves that extend parallel to the stripe that suppress parasitic lateral optical modes; unpumped sections of the stripe that suppress light emission from the narrow waveguide; and facet coatings having distinct reflectance for the light in the narrow and in the broad waveguides thus suppressing emission of light from the narrow waveguide.

17 Claims, 23 Drawing Sheets

U.S. PATENT DOCUMENTS

| | | | | |
|---|---|---|---|---|
| 2007/0290191 | A1* | 12/2007 | Shuchukin et al. | 257/14 |
| 2007/0291805 | A1* | 12/2007 | Ledentsov et al. | 372/38.01 |
| 2008/0069173 | A1* | 3/2008 | Shchukin et al. | 372/98 |
| 2008/0267246 | A1 | 10/2008 | Volodin et al. | |
| 2009/0116525 | A1* | 5/2009 | Shchukin et al. | 372/45.01 |

OTHER PUBLICATIONS

Tilted Cavity Laser, V.A. Shchukin et al., Nanomodeling, edited by Akhlesh Lakhtakia, Sergey A. Maksimenko, Proceedings of SPIE vol. 5508, pp. 61-71, 2004.

Wavelength-stabilized tilted cavity quantum dot laser, N.N. Ledentsov et al., Institute of Physics Publishing, Semiconductor Science and Technology, pp. 1183-1188, 2004.

Edge and Surface-Emitting Tilted Cavity Lasers, N.N. Ledentsov et al., Physicians and Simulation of Optoelectric Devices XIII, Proc. of SPIE vol. 5722, pp. 130-146, 2005.

High brilliance photonic band crystal lasers, V.A. Shchukin et al., Workshop on Optical Components for Broadband Communication, edited by Pierre-Yves Fonjallaz, Thomas P. Pearsall, Proc. of SPIE vol. 6350, pp. 635005-1-635005-15, 2006.

Wavelength-stabilized tilted wave lasers with a narrow vertical beam divergence, I.I. Novikov et al., IOP Publishing, Semiconductor Science and Technology, pp. 1-5, Apr. 23, 2008.

Large-area, single transverse-mode semiconductor laser with diffraction-limited super-Gaussian output, Greg Mowry and James R. Leger, Appl. Phys. Lett. 66(13), Mar. 27, 1995, pp. 1614-1616.

Office Action dated Sep. 15, 2010 for U.S. Appl. No. 12/200,127.

\* cited by examiner (a)

(b)

(c)

SEMICONDUCTOR OPTOELECTRONIC DEVICE WITH IMPROVED BEAM QUALITY

REFERENCE TO RELATED APPLICATIONS

This application claims an invention which was disclosed in
U.S. Provisional Patent Application No. US61/118,550, filed Nov. 28, 2008, entitled "METHOD FOR IMPROVEMENT OF BEAM QUALITY AND WAVELENGTH STABILIZED OPERATION OF TILTED WAVE SEMICONDUCTOR DIODE LASERS" and
U.S. Provisional Patent Application No. US61/245,326, filed Sep. 24, 2009, entitled "METHOD FOR SUPPRESSION OF PARASITIC EMISSION IN A SEMICONDUCTOR DIODE LASER WITH AN EXTENDED".

The aforementioned applications are hereby incorporated herein by reference.

BACKGROUND OF THE INVENTION

1. Field of the Invention

The invention pertains to the field of semiconductor optoelectronic devices. More particularly, the invention pertains to high-power high-brightness semiconductor diode lasers with a narrow beam divergence and to wavelength-stabilized semiconductor diode lasers.

2. Description of Related Art

There is a need in high-power power semiconductor diode lasers for numerous applications including, but not limited to material processing, projection television, frequency conversion, etc. For these applications high power and high brilliance (power emitted in a unit solid angle) are of key importance.

Conventional prior art edge emitting laser. In this approach a narrow waveguide supporting only a single localized waveguide mode is fabricated. Then the gain medium placed in this waveguide interacts predominantly with this mode. Once the feedback through the reflecting facets or distributed feedback mechanism is provided the optical power accumulates in the waveguide, the stimulated emission lifetime shortens and, once the modal gain overcomes total losses, the lasing starts. This approach has severe limitations. First, the output power is limited by the catastrophic optical mirror damage, and all technological improvements including facet passivation, zinc diffusion, or proton bombardment still have limitations in optical power density. To achieve higher power by keeping the same power density one needs using broad waveguide and wide stripe lasers. However, the lasing from broad area lasers is typically multimode and also suffers from beam filamentation which renders the laser radiation not focusable. Attempts to stabilize fundamental mode lasing are further complicated by the fact that the high-order modes, propagating at a larger effective tilt angle to the axis of the waveguide, (e.g. high-order vertical modes), experience a higher facet reflectivity, the power accumulated in these modes is higher, the stimulated emission lifetime is shorter and the lasing can be initiated through these modes. Even if the lasing starts via the fundamental mode, or example, due to the higher optical confinement factor for these mode, once the excitation density is increasing, high-order modes evolve due to the special gain depletion and the gain spectrum hole burning effects for the fundamental mode. Once the objective is to obtain a high optical power focused onto a small spot, then a two-stage approach, where semiconductor diode laser operates as a pump source for pumping solid state laser and then an optical beam emitted from the solid state laser is used, however this is extremely expensive. Therefore there is a need in the art in semiconductor diode laser allowing high power narrow beam divergence single vertical mode lasing.

Furthermore once an objective is just to pump a solid state laser by a semiconductor diode laser, a requirement on wavelength stabilization arises, as the photon energy corresponding to the lasing wavelength must be in a relatively narrow resonance with a relevant optical transition in the active medium of the solid state laser.

A requirement on wavelength stabilization of a semiconductor diode laser may arise also for frequency conversion application, if a non-linear crystal has a relatively narrow energy band, in which the conversion efficiency is high.

Thus a need in broad waveguide lasers operating in a single mode, allowing also wavelength stabilization exists.

A novel concept allowing such a device has been proposed in the U.S. Pat. No. 7,421,001, filed Jun. 16, 2006, entitled "EXTERNAL CAVITY OPTOELECTRONIC DEVICE", issued Sep. 2, 2008, and in the U.S. Pat. No. 7,583,712, filed Jan. 3, 2007, entitled "OPTOELECTRONIC DEVICE AND METHOD OF MAKING SAME", issued Sep. 1, 2009, both by the inventors of the present invention, whereas these both patents are incorporated herein by reference.

FIG. 1(a) shows a schematic diagram of a semiconductor diode laser (100) disclosed in the U.S. Pat. No. 7,421,001, by the inventors of the present invention. The device comprises a substrate (101), a waveguide (103), and a top cladding layer (129). The light generated within the waveguide propagates along the waveguide, which is shown schematically by the dashed line (104). Light propagating along the waveguide leaks to the substrate (101), propagates through the substrate, is reflected back from the back surface (131) of the substrate, and returns to the waveguide (103). Light in the substrate forms a tilted optical mode, or tilted wave (134). As the substrate thickness, which typically ranges from 50 to 300 micrometers significantly exceeds the thickness of the waveguide (103), the output light comes mainly from the substrate. The output light is emitted in two vertical lobes (145).

FIG. 1(b) shows a schematic diagram of a device (100) in more detail. The substrate (101) is formed from any III-V semiconductor material or III-V semiconductor alloy. For example, GaAs, InP, GaSb. GaAs or InP are generally used depending on the desired emitted wavelength of laser radiation. Alternatively, sapphire, SiC or [111]-Si is used as a substrate for GaN-based lasers, i.e. laser structures, the layers of which are formed of GaN, AlN, InN, or alloys of these materials. The substrate (101) is preferably doped by an n-type, or donor impurity. Possible donor impurities include, but are not limited to S, Se, Te, and amphoteric impurities like Si, Ge, Sn, where the latter are introduced under such technological conditions that they are incorporated predominantly into the cation sublattice to serve as donor impurities.

The n-doped bottom cladding layer (122) is formed from a material lattice-matched or nearly lattice-matched to the substrate (101), is transparent to the generated light, and is doped by a donor impurity. In the case of a GaAs substrate (101), the n-doped cladding layer is preferably formed of a GaAlAs alloy.

The n-doped layer (124) of the waveguide (120) is formed from a material lattice-matched or nearly lattice-matched to the substrate (101), is transparent to the generated light, and is doped by a donor impurity. In the case of a GaAs substrate, the n-doped layer (124) of the waveguide is preferably formed of GaAlAs alloy having an Al content lower than that in the n-doped cladding layer (122).

The p-doped layer (126) of the waveguide (120) is formed from a material lattice-matched or nearly lattice-matched to the substrate (101), is transparent to the generated light, and is doped by an acceptor impurity. Preferably, the p-doped layer (126) of the waveguide is formed from the same material as the n-doped layer (124) but doped by an acceptor impurity. Possible acceptor impurities include, but are not limited to, Be, Mg, Zn, Cd, Pb, Mn and amphoteric impurities like Si, Ge, Sn, where the latter are introduced under such technological conditions that they are incorporated predominantly into the anion sublattice and serve as acceptor impurities.

The p-doped cladding layer (129) is formed from a material lattice-matched or nearly lattice-matched to the substrate (101), transparent to the generated light, and doped by an acceptor impurity.

The p-contact layer (109) is preferably formed from a material lattice-matched or nearly lattice matched to the substrate, is transparent to the generated light, and is doped by an acceptor impurity. The doping level is preferably higher than that in the p-cladding layer (129).

The metal contacts (111) (shown in FIG. 1(c)) and (112) are preferably formed from the multi-layered metal structures. The metal n-contact (111) is preferably formed from a structure including, but not limited to the structure Ni—Au—Ge. Metal p-contacts (112) are preferably formed from a structure including, but not limited to, the structure Ti—Pt—Au.

A window is formed on the back side of the substrate, where no bottom, or n-contact (111) is deposited, and the back substrate surface is mirror-like.

The confinement layer (125) is formed from a material lattice-matched or nearly lattice-matched to the substrate (101), is transparent to the generated light, and is either undoped or weakly doped. The active region is preferably placed within the confinement layer (125) is preferably formed by any insertion, the energy band gap of which is narrower than that of the layers (122), (124), (126) and (129). Possible active regions include, but are not limited to, a double heterostructure, a single-layer or a multi-layer system of quantum wells, quantum wires, quantum dots, or any combination thereof. In the case of a device on a GaAs-substrate, examples of the active region include, but are not limited to, a system of insertions of InAs, $In_{1-x}Ga_xAs$, $In_xGa_{1-x-y}Al_yAs$, $In_xGa_{1-x}As_{1-y}N_y$, or similar materials.

Highly reflecting coat (117) is preferably mounted on the rear facet of the device, and an anti-reflecting coat (116) is preferably mounted on the front facet of the device.

The device operates as follows. The active region generates gain, when a forward bias is applied. Light (104) generated in the leaky waveguide (120) leaks to the substrate (101). Light in the substrate propagates (134) at a certain leaky angle $\vartheta_{leaky}$ to the plane of the substrate surface. Light is reflected back from the back surface (131) of the substrate. Thus, in addition to the central part of the waveguide (120), wherein (120) may be considered as a first cavity, a second cavity is formed between the leaky waveguide (120) and the back surface of the substrate (131). Since the thickness of the substrate significantly exceeds the wavelength of light in the vacuum (preferred wavelengths of light range between 300 nm and 3 µm), the propagation of light in the substrate obeys the laws of geometrical optics. Therefore, in order to allow the exit of light from the substrate through the facet, it is necessary that the leaky angle $\vartheta_{leaky}$ is below the angle of the total internal reflection at the semiconductor-air interface. Then, light comes out (145) through the front facet forming preferably a two-lobe far-field pattern with narrow lobes.

If the back surface of the substrate is polished, the light reflects back to the active region layer and no significant part of the light is lost. The threshold current density is low, even if the nominal leakage loss from the waveguide (120) is high. Moreover, the light coming back from the substrate to the waveguide (103), interferes with light (104) propagating just along the waveguide (103). When phase matching conditions hold, constructive interference between light propagating in the waveguide (103) and light returned from the substrate occurs. The phase matching conditions are met only at certain wavelengths which results in wavelength selectivity. In different approaches, the back side of the substrate may be coated, etching may be applied to enable wavelength adjustment, gratings can be deposited to additionally improve wavelength stabilization or enabling grating outcoupling of the light through the substrate, and so on. One or a few coatings can be deposited on the back surface of the substrate to protect the mirror-like quality of the surface.

FIG. 1(c) shows a schematic diagram of a device with a reflection from the substrate surface with an example of one of possible processing layouts, where selective deposition of the bottom n-type contact (111) leaves some parts of the back substrate surface (131) uncovered forming a mirror like semiconductor/air interface enabling a mirror like reflection of light from the back side of the substrate.

The lasing of the device (100) occurs, when the phase matching conditions between the light (104) propagating along the waveguide (103) and light leaking to the substrate, propagating in the substrate (134), reflecting back from the back surface of the substrate (131), and returning to the active region (125), are met. This occurs only for selected vertical optical modes and for selected wavelengths, which enables both single vertical mode operation and wavelength-selective operation.

An alternative way of creating a single-mode vertical lasing from a broad vertical waveguide has been taught in the U.S. Pat. No. 7,583,712, filed Jan. 3, 2007, entitled "OPTOELECTRONIC DEVICE AND METHOD OF MAKING SAME", issued Sep. 1, 2009, by the inventors of the present invention, this patent being incorporated herein by reference. Instead of leakage of light to the substrate, leakage of light into a second cavity is employed. FIG. 2 illustrates schematically a laser (200) comprising a first cavity, or a first waveguide (253) and a second cavity, or a second waveguide (203) separated by an intermediate cladding layer (250). The first waveguide (253) is thus bounded by the top cladding layer (258) and the intermediate cladding layer (250). The second waveguide is bounded by the bottom cladding layer (202) and the intermediate cladding layer (250). The active region (256) is placed within the first waveguide (253). The device (200) is preferably grown on an n-doped substrate (201). The bottom cladding layer (202), the second cavity (203), the intermediate cladding layer (250), and the layer (254) are preferably n-doped. The layer (257) and the top cladding layer (258) are preferably p-doped. The heavily p-doped p-contact layer (109) is placed on top of the top cladding layer (258). The bottom n-type contact (111) is deposited on the back side of the substrate. The top p-type contact (112) is deposited on top of the p-contact layer (109).

The active region (256) generates light when a forward bias (213) is applied. Light generated in the active region leaks from the first waveguide (253) through the intermediate cladding layer (250) into the second waveguide (203), propagates in the second waveguide (203), is reflected back from the bottom cladding layer (202) and returns back to the first waveguide (253). Lasing occurs when the phase matching conditions are met between light propagating just in the first waveguide (253) and light leaking to the second waveguide (203) and returning back.

FIG. 2 illustrate a tilted optical mode (270) in the first waveguide (253) and a tilted optical mode (220) in the second waveguide (203). The interaction between the optical modes of two cavities results in the formation of a combined optical mode of the entire device (200). The thickness of the first waveguide (253) does not preferably exceed three times the wavelength of light in the vacuum, whereas the second waveguide (203) is much broader, and can reach typical dimensions of 10 to 30 micrometers. Such extension of the second waveguide leads to the laser emission in two narrow vertical lobes (245).

FIG. 3(a) illustrates the principle of the wavelength selection. Referring to the laser (200), each of the two waveguides (253) and (203), confines optical modes. Optical modes confined in each of the waveguides may be described by dispersion laws relating the wavelength of light in the optical mode and the effective tilt angle of the mode. The wavelength of the optical mode confined in the narrower waveguide (253), as a function of the mode angle $\vartheta$, is described by a solid curve in FIG. 3(a). The wavelength of the optical modes confined in the broader waveguide (203), as a function of the mode angle $\vartheta$, is given by dashed curves. The phase matching condition for the device (200) is met at an intersection point of the two curves. As the thickness of the broader waveguide (203) significantly exceeds the thickness of the narrower waveguide (253), the spacing between the optical modes of the broader waveguide (203) in FIG. 3(a) is smaller than the spacing between the modes of the narrower waveguide (253). The laser (200) generates laser light at one or a few selected wavelengths, at which phase matching conditions are met, and a constructive interference and, hence, a positive feedback occurs. Namely, these are wavelengths $\lambda_1$, $\lambda_2$ and $\lambda_3$ in FIG. 3(a). The spectrum of laser radiation is also illustrated in FIG. 3(b). If only one selected wavelength overlaps with the luminescence spectrum of the active region (256) of the device (200), the device will generate wavelength-stabilized laser light.

The interaction between the optical modes confined in the first, narrow waveguide (253) and the modes of the second, broad waveguide (203) determines the optical mode of the entire device (200) and, hence, the far field pattern of the laser radiation. The far field pattern is shown schematically in FIG. 3(c). Generally, the far field pattern contains two narrow lobes generated from the broad waveguide (203) and a broad angular spectrum generated from the narrow waveguide (253). If narrow far field is targeted, the narrow waveguide (253) and the leaky angle $\vartheta$ are engineered preferably in such a way, to ensure that most of the optical power is emitted in the narrow lobes. Preferably, more than eighty percent of the total optical power is emitted in the narrow lobes.

The same applies to a laser (100) of FIG. 1, wherein the substrate is employed as a broad waveguide.

If only a single lobe emission is targeted, this can be achieved by employing external mirrors. FIG. 4 shows a schematic diagram of an apparatus (400) enabling laser emission in a single narrow vertical lobe. Primarily, the laser (100) emits light which has a two-lobe far field (145). Correspondingly, two collecting mirrors (441) and (442) are used to reflect light back (146) to the facet. One of the mirrors (441) may be chosen semi-transparent to allow laser light coming out (445) having a single lobe far field. The apparatus (400) comprises an edge-emitting device (100), a first cavity between the facet (407) and the mirror (441), a second cavity between the facet (407) and the mirror (442), a non-transparent collecting mirror (442), and a semi-transparent collecting mirror (441).

Similarly, laser light in a single narrow lobe may be obtained from an apparatus, combining a laser (200) of FIG. 2 and a similar set of external mirrors.

Another possibility of a laser having an extended waveguide is a laser based on a vertical photonic band crystal disclosed in the U.S. Pat. No. 6,804,280, filed Sep. 4, 2001, entitled "SEMICONDUCTOR LASER BASED ON THE EFFECT OF PHOTONIC BAND GAP CRYSTAL-MEDIATED FILTRATION OF HIGHER MODES OF LASER RADIATION AND METHOD OF MAKING THE SAME", issued Oct. 12, 2004, by the inventors of the present invention, whereas this patent is incorporated herein by reference.

Yet another possibility of a laser having an extended waveguide is a tilted cavity laser disclosed in the U.S. Pat. No. 7,031,360, filed Feb. 12, 2002, entitled "TILTED CAVITY SEMICONDUCTOR LASER (TCSL) AND METHOD OF MAKING SAME", issued Apr. 18, 2006, by the inventors of the present invention, whereas this patent is incorporated herein by reference.

In what follows, a tilted wave laser will be referred to as an example. A one skilled in the art will appreciate that the present invention refers to all types of semiconductor lasers having an extended waveguide.

FIGS. 5(a) and 5(b) show schematic diagrams comparing two basic realizations of the tilted wave laser. Both comprise a narrow waveguide and a broad waveguide coupled via a thin cladding layer. In FIG. 5(a) the substrate is employed as a broad waveguide. In FIG. 5(b) the broad waveguide is a layer grown epitaxially on a substrate. The functionality of both types of the tilted wave laser is basically the same. The only important difference is the thickness of the broad waveguide. A typical thickness of a waveguide grown epitaxially on a substrate may be within a range from 5 micrometers to 30 micrometers. The thickness of a substrate is typically within a range from 50 micrometers to 300 micrometers.

The advantage of using a substrate as a broad waveguide is a much simpler epitaxial growth and a larger thickness, if needed. The disadvantage of using a substrate as a broad waveguide is a necessity of special processing, e.g. as shown in FIG. 1(c) in order to reach mirror-like reflection of light from the back surface.

The advantage of using an epitaxial layer as a broad waveguide is a high quality epitaxial interface between the broad waveguide and bottom thick cladding layer which ensures the mirror-like reflection of light. Visible disadvantages are a need to grow epitaxially a thick layer which adds to the costs and limitations on the thickness.

If the targeted wavelength of light is such that the typical commercially available substrates are not transparent (e.g., GaAs substrate is absorbing at the wavelengths $\lambda < 870$ nm), then only such a device is possible where a broad waveguide is realized as an epitaxial layer of a different material (e.g., as a transparent GaAlAs alloy).

FIG. 6 shows the refractive index profile and the optical mode profile for an example tilted wave laser, wherein the 100 micrometer-thick substrate is employed as a broad waveguide. FIG. 6(a) shows the refractive index profile on a coarse scale. FIG. 6(b) demonstrates the profile of the optical mode, showing specifically the electric field strength profile (the near-field profile). The near field profile reveals a strong peak within the narrow waveguide and an oscillatory behavior in the substrate. FIG. 6(c) shows the refractive index profile and the optical mode profile on a fine scale within the narrow waveguide.

FIGS. 7(a) and 7(b) show the far-field pattern of the optical mode of FIG. 6(b). FIG. 7(a) shows the far-field pattern on a linear scale, and FIG. 7(b) shows the far-field pattern on a logarithmic scale allowing identify all features. The far-field pattern contains two narrow lobes, an oscillatory background, and a broad angular spectrum (central lobe). The two narrow lobes originate from the tilted wave in the broad waveguide. The oscillatory background comes from a finite thickness of the broad waveguide. The broad angular spectrum originates from the light in the narrow waveguide.

FIG. 8(a) shows schematically another possibility of lasing from a laser comprising a narrow waveguide (820) coupled to a substrate (101) through a thin cladding layer (822), a so called leaky laser (800). Light generated in the active medium located in the narrow waveguide leaks to the substrate (834) and then is emitted (845) from the substrate through the facet. Furthermore, light is also emitted (841) from the narrow waveguide (820). In this case no significant reflection from the back side of the substrate and no return of light to the narrow waveguide occurs. Light is emitted in the form of a single narrow lobe (855) and a broad angular spectrum (851) as shown in FIG. 8(b).

In a real device both types of lasing, one in the tilted mode as shown in FIG. 3(a) and one in the leaky mode as shown in FIG. 8(b) can coexist. In certain regimes, the lasing can start at threshold as tilted wave lasing, but, as the drive current increase, the temperature in the active region increases thus increasing the refractive index. This leads to localization of the optical mode and to enhancement of the emission in a broad angular peak.

Once the high power high brightness lasing is required for certain applications, the goal is to improve the characteristics of a tilted wave lasers such that the relative fraction of the output power in the narrow beams is maximized and the relative fraction of the output power in the broad angular spectrum emitted from a narrow waveguide is minimized. Thus, there is a need in the art to further improve the beam quality of the tilted wave laser and stabilize the tilted wave lasing in the two narrow vertical beams The present invention discloses means to additionally configure the tilted wave laser specifically to attain this goal. Furthermore, wavelength stabilized operation can occur only in a tilted wave mode. Therefore, is the wavelength-stabilized operation of a laser is a goal, the lasing in a mode of the narrow waveguide must be suppressed.

SUMMARY OF THE INVENTION

The present invention refers to a method for improving the functionality of a semiconductor diode laser having an extended vertical waveguide, wherein the active medium is located closer to the top cladding layer of the waveguide. The vertical optical modes of the laser include at least one vertical optical mode extended over the entire extended vertical waveguide and at least one vertical optical mode localized at the active medium. The goal of using a laser with an extended vertical waveguide is to obtain lasing in narrow beams with high brightness and/or wavelength stabilized lasing. In both cases lasing in a localized mode is highly undesirable due to the resulting reduced brightness of the device and disadvantages related to the catastrophic optical damage of the mirrors of the facet for the localized mode and needs to be suppressed.

The present invention discloses several methods of configuring the tilted wave laser in the longitudinal direction. In one embodiment of the present invention the resonator length (in the longitudinal direction) is specifically selected to be equal to the length of the return path of the tilted wave multiplied by a rational number such that the tilted wave in the extended vertical waveguide forms a closed loop. In this embodiment, the lasing from the narrow waveguide, in which the active medium is located, is suppressed.

In yet another embodiment of the present invention, the resonator length is specifically selected to be equal to the length of the return path of the tilted wave multiplied by a rational number such that the tilted wave in the broad waveguide forms a closed loop. In this embodiment however, the selection of the resonator length allows enhancement of the wavelength selectivity of the device thus improving the wavelength-stabilized operation.

In a further embodiment of the present invention, a tilted wave laser further comprises an unpumped section. This is preferably located close to the front facet, thus suppressing the light output power emitted from the narrow waveguide in a broad angular spectrum. This enhances the fraction of the light output power concentrated in the narrow lobes.

In another embodiment of the present invention, an unpumped section is configured such to enhance the wavelength selectivity of the device.

In yet another embodiment, the device comprises a plurality of unpumped sections. In a further embodiment the plurality of unpumped sections form a periodic structure. In another embodiment the periodic structure of unpumped sections has a period equal to the length of the return path of the tilted wave multiplied by a rational number.

In a further embodiment additional means are introduced in order to suppress parasitic emission of light. Parasitic spontaneous emission and the feedback in the closed lateral mode can be suppressed by forming groves, which penetrate deeply to the broad waveguide and are directed parallel or at a certain angle to the stripe. In another embodiment, closed lateral modes can be suppressed by scribing the side facets of the chip. In yet another embodiment, the closed lateral modes can be suppressed by forming side facets non parallel to each other.

In yet another embodiment, the lasing from the localized optical modes is suppressed by forming grooves perpendicular to the stripe and crossing the stripe, whereas the grooves preferably penetrate to the depth corresponding to the vertical extension of the localized mode. In another embodiment, grooves crossing the stripe are formed at a tilted angle to the stripe. In yet another embodiment the lasing from the narrow waveguide is suppressed by tilted cleaving the top part of a front and/or of a rear facet.

BRIEF DESCRIPTION OF THE DRAWINGS

FIG. 10(a) corresponds to the situation where the resonator length exceeds the length of the return path of the tilted wave. In such a structure, a ray in the broad waveguide reflected from one facet reaches the narrow waveguide at least once before it impinges on another facet.

FIG. 18(b) refers to the structure where the resonator length is shorter than the return path of the tilted wave. In such a structure, a ray leaking from the narrow waveguide into a broad waveguide impinges on a facet earlier than returns back to the narrow waveguide.

FIG. 12(a) refers to the waves propagating in the positive x-direction at a point $x_0$, which is close to the left facet $F_1$, i.e. at a distance from the facet shorter than the tilted wave return path. The optical ray incoming to the narrow waveguide at the point $x_0$ undergoes reflection from the facet $F_1$ before it impinges the narrow waveguide.

FIG. 20(b) refers to the waves propagating in the positive x-direction at a point $x_0$, which is far enough from the left facet $F_1$, i.e. at a distance from the facet longer than the tilted wave return path. The optical ray incoming to the narrow waveguide at the point $x_0$ does not undergo reflection from any facet before it impinges the narrow waveguide.

FIG. 20(c) refers to the waves propagating in the negative x-direction at a point $x_0$, which is close to the right facet $F_2$, i.e. at a distance from the facet shorter than the tilted wave return path. The optical ray incoming to the narrow waveguide at the point $x_0$ undergoes reflection from the facet $F_2$ before it impinges the narrow waveguide.

FIG. 20(d) refers to the waves propagating in the positive x-direction at a point $x_0$, which is far enough from the right facet $F_1$, i.e. at a distance from the facet longer than the tilted wave return path. The optical ray incoming to the narrow waveguide at the point $x_0$ does not undergo reflection from any facet before it impinges the narrow waveguide.

FIG. 21(a) refers to a structure, where the resonator length equals the length of the return path of the tilted wave. The path of the tilted wave in the broad waveguide forms a closed loop, wherein the tilted wave returns 2 times to the narrow waveguide on the double path along the resonator.

FIG. 21(b) refers to a structure, where the resonator length equals twice the length of the return path of the tilted wave. The path of the tilted wave in the broad waveguide forms a closed loop, wherein the tilted wave returns 4 times to the narrow waveguide on the double path along the resonator.

FIG. 21(c) refers to a structure, where the resonator length equals three halves the length of the return path of the tilted wave. The path of the tilted wave in the broad waveguide forms a closed loop, wherein the tilted wave returns 3 times to the narrow waveguide on the double path along the resonator.

FIG. 21(d) refers to a structure, where the resonator length equals five fourths the length of the return path of the tilted wave. The path of the tilted wave in the broad waveguide forms a closed loop, wherein the tilted wave returns 5 times to the narrow waveguide as the light makes twice the double path along the resonator.

FIG. 22(a) repeats FIG. 21(a) and refers to the structure wherein the resonator length equals the length of the return part of the tilted wave to the narrow waveguide.

FIG. 23(a) refers to a structure, where the resonator length equals the length of the return path of the tilted wave. The path of the tilted wave in the broad waveguide forms a closed loop, wherein the tilted wave returns 2 times to the narrow waveguide on the double path along the resonator.

FIG. 23(b) refers to a structure, where the resonator length equals twice the length of the return path of the tilted wave. The path of the tilted wave in the broad waveguide forms a closed loop, wherein the tilted wave returns 4 times to the narrow waveguide on the double path along the resonator.

FIG. 23(c) refers to a structure, where the resonator length equals three halves the length of the return path of the tilted wave. The path of the tilted wave in the broad waveguide forms a closed loop, wherein the tilted wave returns 3 times to the narrow waveguide on the double path along the resonator.

FIG. 23(d) refers to a structure, where the resonator length equals five fourths the length of the return path of the tilted wave. The path of the tilted wave in the broad waveguide forms a closed loop, wherein the tilted wave returns 5 times to the narrow waveguide as the light makes twice the double path along the resonator.

DETAILED DESCRIPTION OF THE INVENTION

Figure 1:
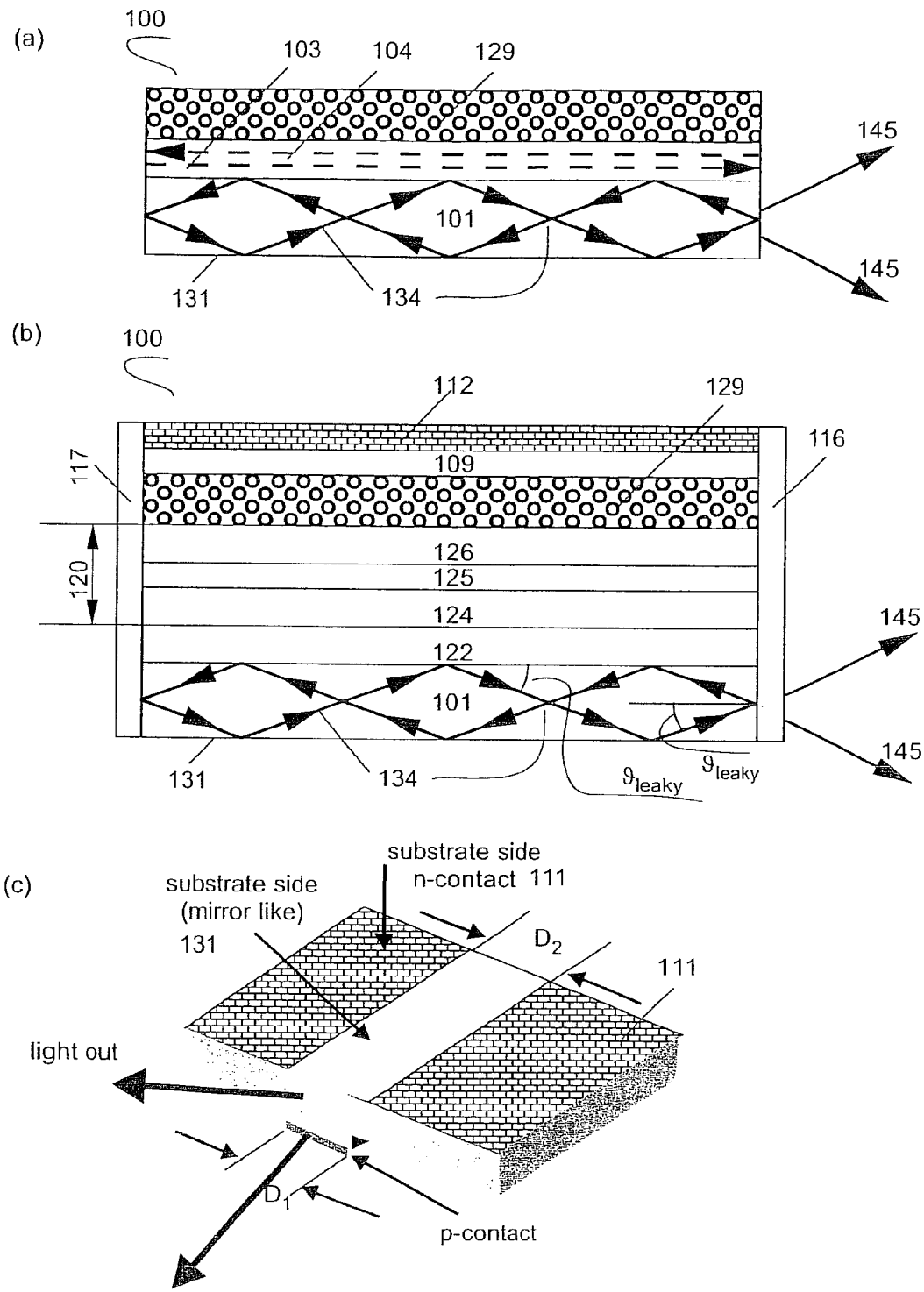
FIG. 1(a) shows a schematic diagram of a device employing the phase matching effect for the vertical optical modes based on the optical mode leaking to the substrate and reflecting from the back side of the substrate.
FIG. 1(b) shows a schematic diagram of the device of FIG. 1(a) in more detail.
FIG. 1(c) shows a schematic diagram of a device of FIG. 1(b) with an example of one of possible processing layouts.
Figure 2:
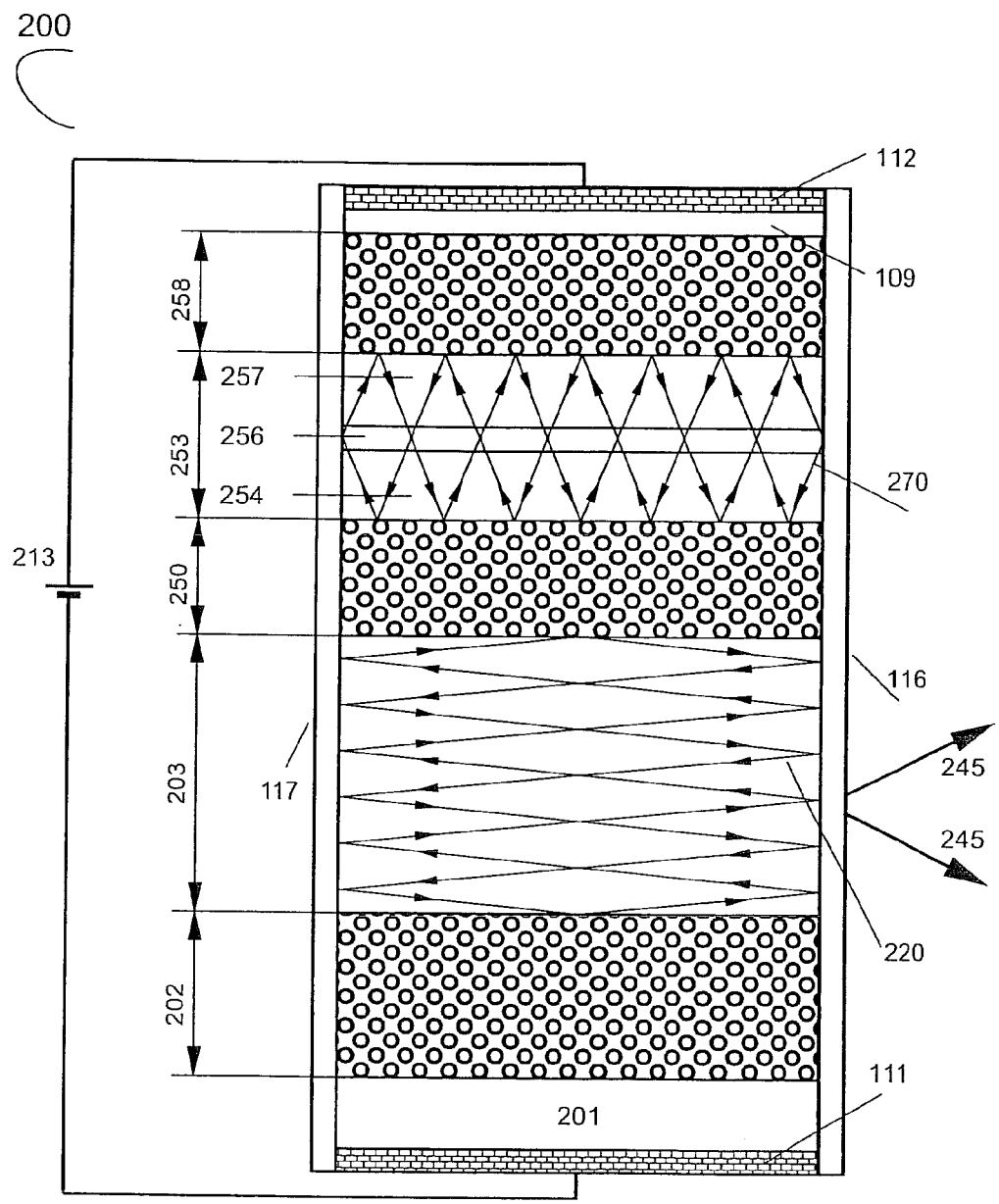
FIG. 2 shows a schematic diagram of a device employing the phase matching effect for the vertical optical modes in an epitaxial structure comprising two coupled cavities.
Figure 3:
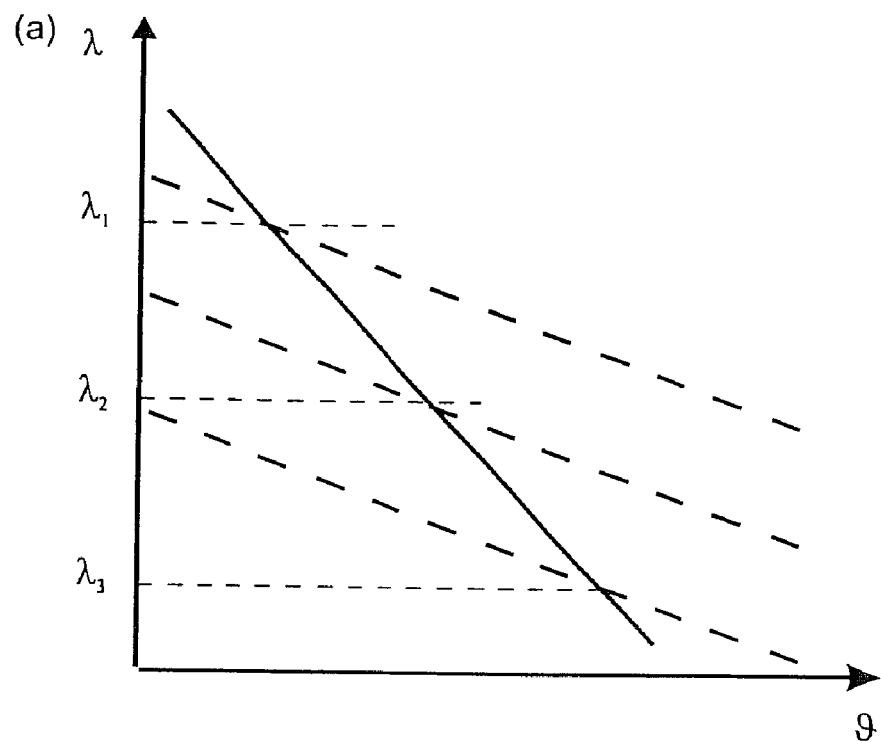
FIG. 3(a) shows the dispersion law curves corresponding to the tilted optical modes of two coupled cavities illustrating wavelength-stabilized operation of the apparatuses of the present invention.
FIG. 3(b) shows a schematic representation of an emission spectrum of a device of FIG. 2.
FIG. 3(c) shows a schematic representation of a far field pattern of a device of FIG. 2.
Figure 3:
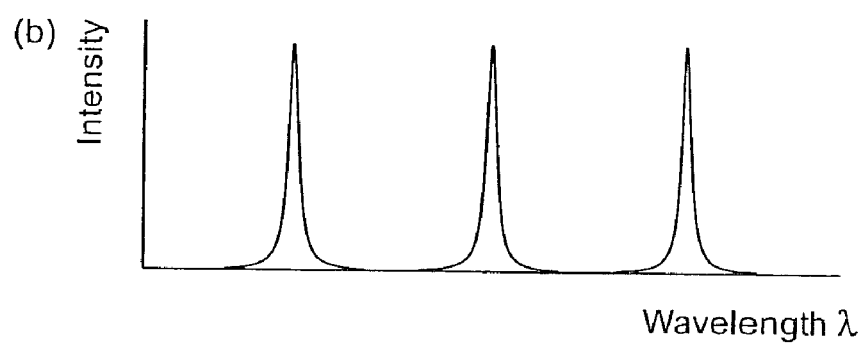
Figure 3:
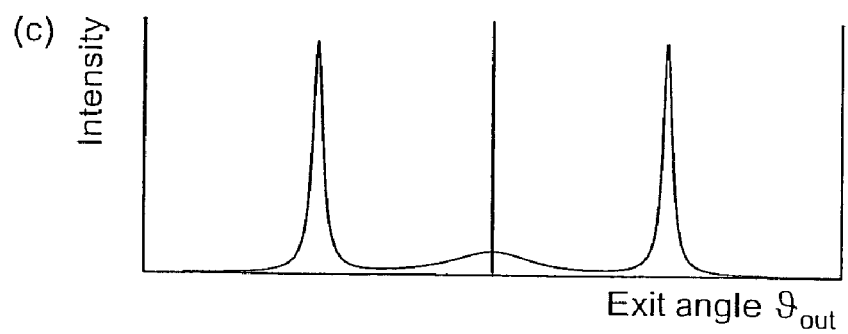
Figure 4:
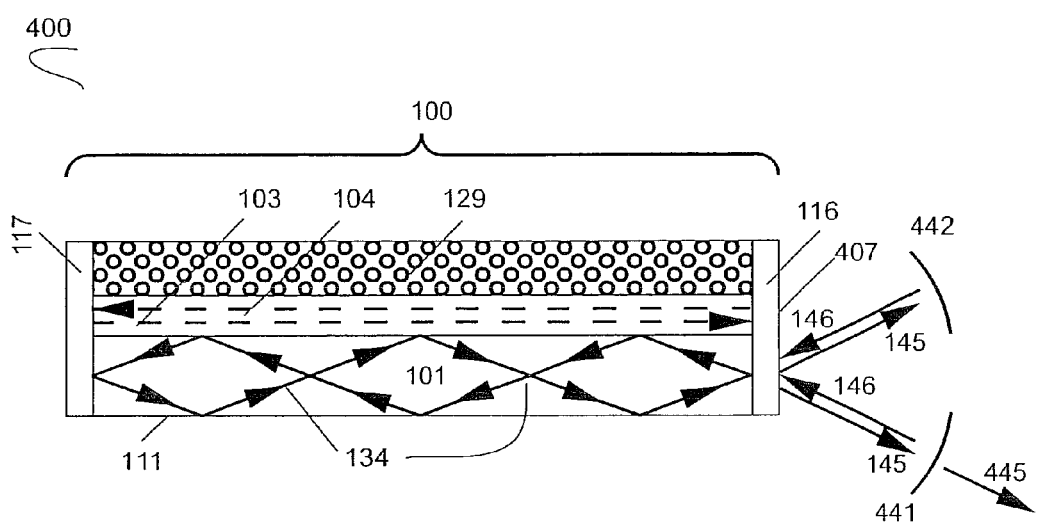
FIG. 4 shows a schematic representation of a laser employing phase matching effect for the vertical modes operating in the external cavity geometry allowing a single lobe vertical far field pattern.
Figure 5:
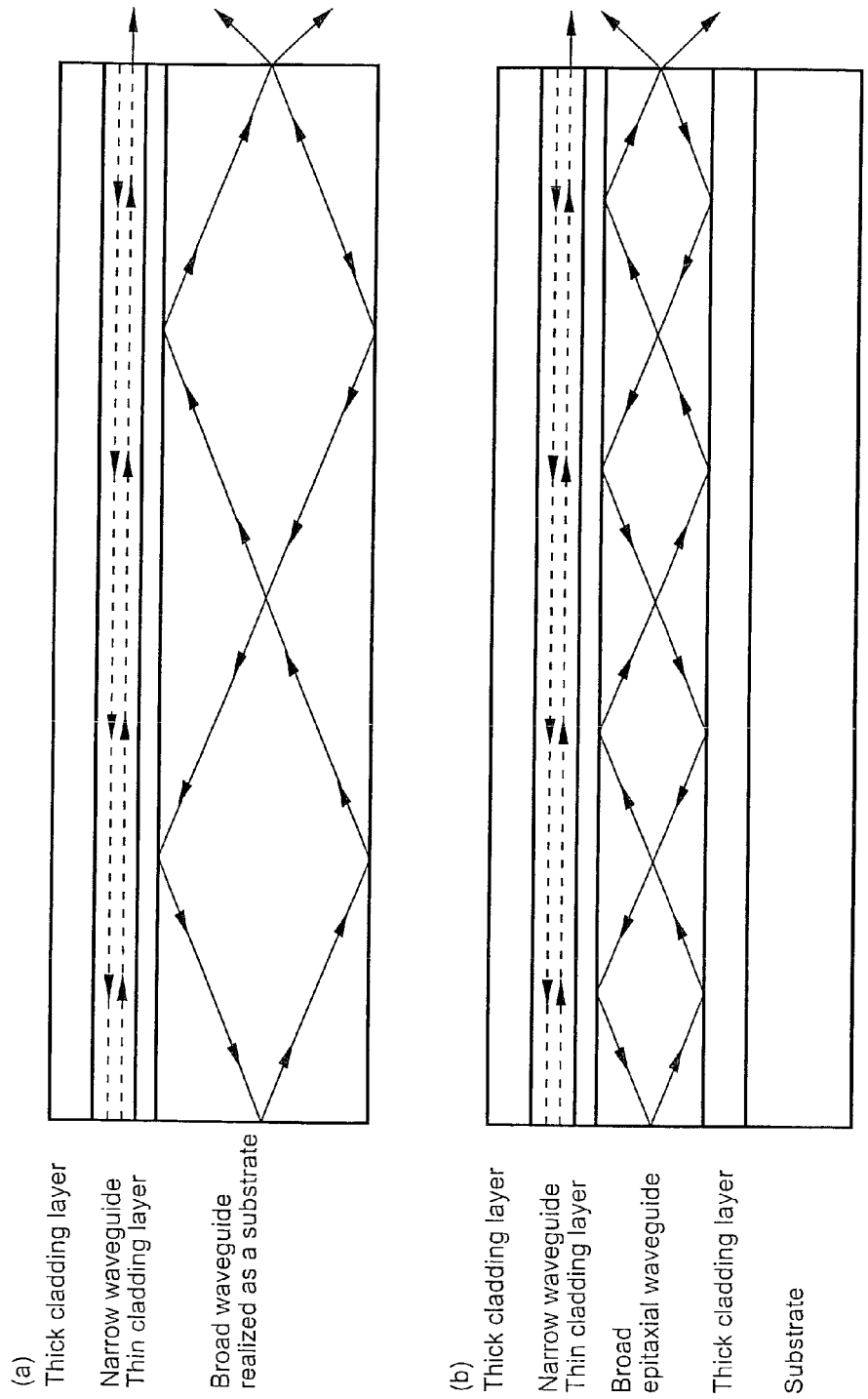
FIG. 5(a) shows a schematic diagram of a device comprising a narrow waveguide coupled with a broad waveguide via a thin cladding layer, wherein the device employs the phase matching effect for the vertical optical modes in a multilayer epitaxial structure, and wherein the substrate is employed as a broad waveguide.
FIG. 5(b) shows a schematic diagram of a device comprising a narrow waveguide coupled with a broad waveguide via a thin cladding layer, wherein the device employs the phase matching effect for the vertical optical modes in a multilayer epitaxial structure, and wherein the substrate is employed as a broad waveguide is grown epitaxially on the substrate.
Figure 6:
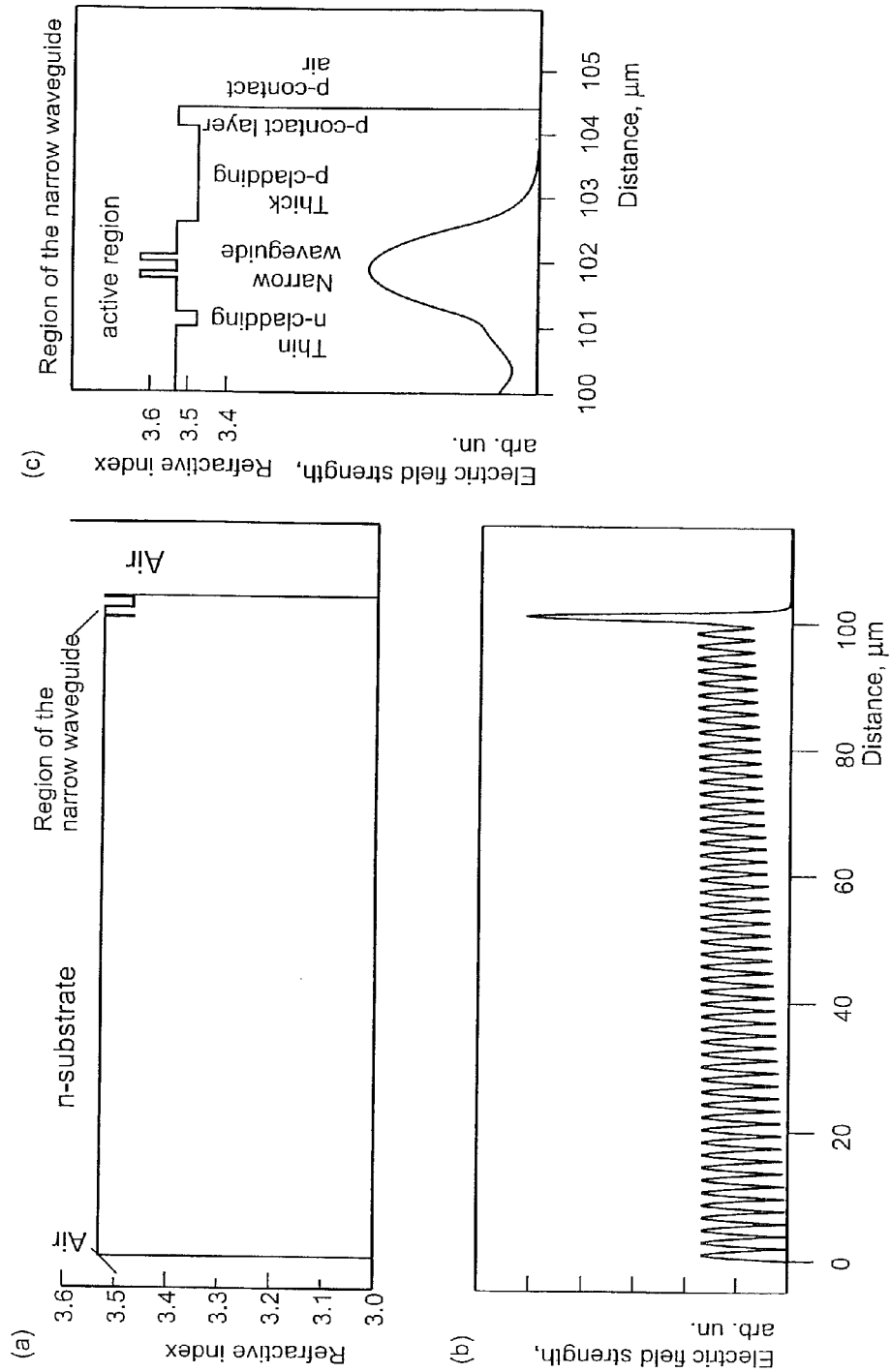
FIG. 6(a) shows a refractive index profile for a tilted wave laser, in which the substrate is employed as a broad waveguide providing phase matching effect.
FIG. 6(b) shows a near field profile of the vertical optical mode of the tilted wave laser of FIG. 6(a) showing particularly the electric field strength profile.
FIG. 6(c) shows the refractive index profile of FIG. 6(a) and the electric field strength profile of FIG. 6(b) at a larger magnification for the region of the narrow waveguide.
Figure 9:
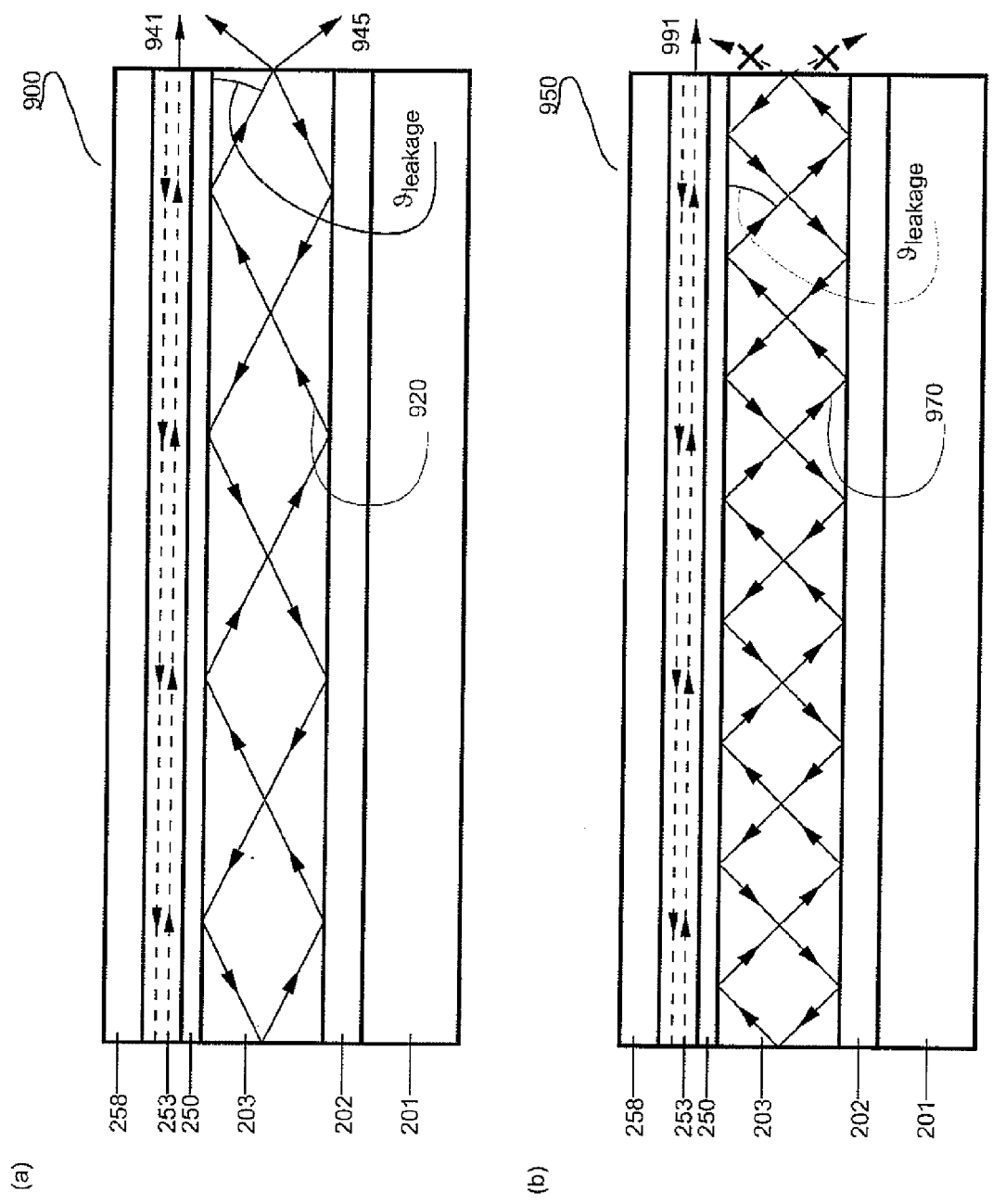
FIG. 9(a) shows a schematic diagram of a tilted wave laser, basically repeating FIG. 5(b).
FIG. 9(b) shows a schematic diagram of a tilted wave laser with a larger leakage angle, wherein the light in a broad waveguide exhibits the total internal reflection at the facet.

FIG. 9 demonstrates a possible extension of the tilted wave laser. FIG. 9(a) shows schematically a tilted wave laser (900) similar to the one of FIG. 5(b). Light propagates in the broad waveguide (203) in a tilted mode (920) and comes out from the broad waveguide (945) and from the narrow waveguide (941). FIG. 9(b) shows schematically a tilted wave laser according (950) to one embodiment of the present invention. The narrow waveguide and the broad waveguide are selected such that the leakage angle defined by the equation $$\vartheta_{leakage} = \cos^{-1}\left(\frac{n_{eff}^{narrowWG}}{n^{broadWG}}\right), \qquad \text{(Eq. 1)}$$

where $n_{eff}^{narrow\ WG}$ is the effective refractive index of the optical mode in the narrow waveguide, and $n^{broad\ WG}$ is the refractive index of the broad waveguide, exceed the angle of the total internal reflection at the semiconductor/air interface, $$\vartheta_{leakage} > \sin^{-1}\left(\frac{1}{n^{broadWG}}\right). \qquad \text{(Eq. 2)}$$

Figure 7:
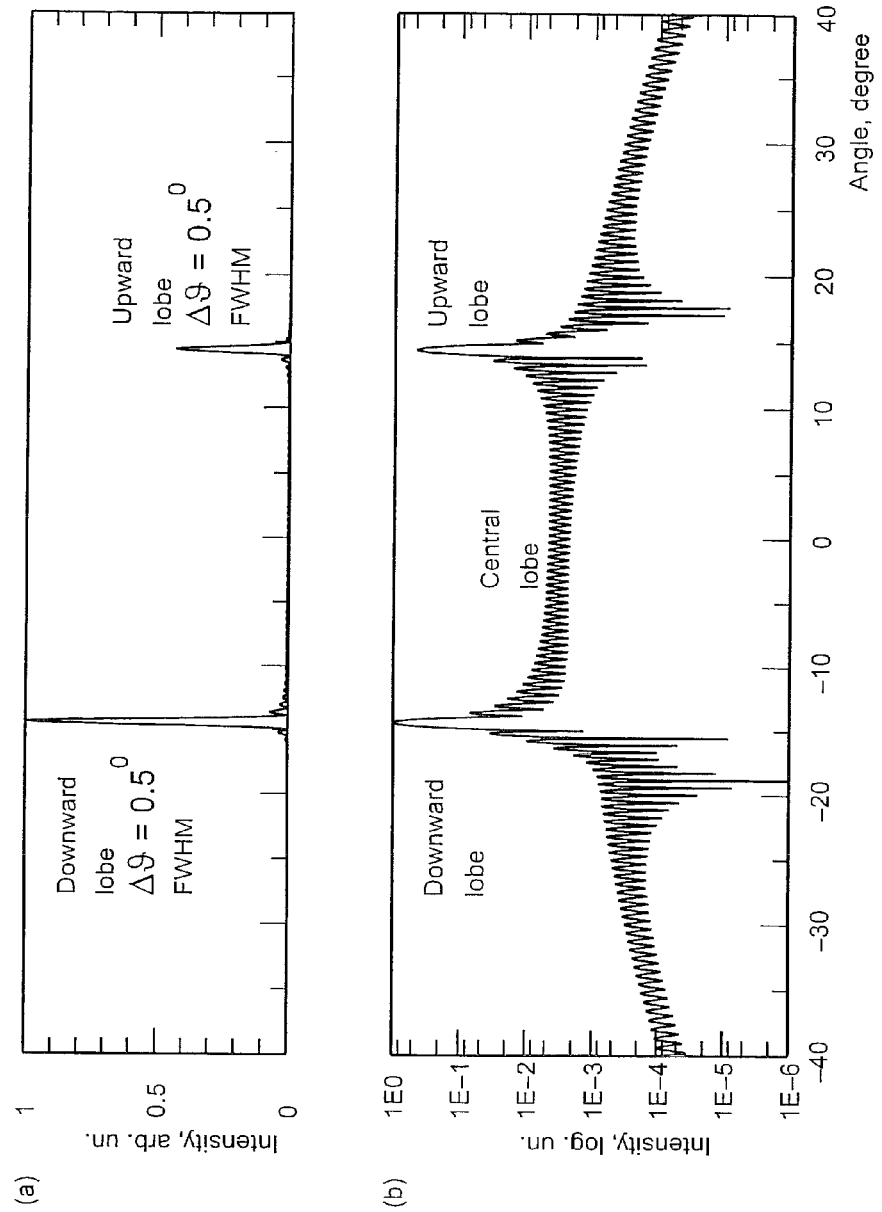
FIG. 7(a) shows schematically the vertical far field profile of the optical mode of the tilted wave laser revealing two narrow lobes, corresponding to the near field profile of FIG. 6(b).
FIG. 7(b) shows schematically the vertical far field profile of the optical mode of the tilted wave laser of FIG. 7(a) on the logarithmic scale, revealing, in addition to two narrow lobes, also a broad central lobe and an oscillatory structure.

Then light in the broad waveguide (203), propagating in a tilted mode (970) will exhibit the total internal reflection at the semiconductor/air interface at the laser facet. Then light will not come out of the broad waveguide which is illustrated by "X" it out symbol on the lines. Only the lasing from the narrow waveguide will be possible (991). The exact far field profile will contain, contrary to that in FIGS. 7(a) and 7(b), no narrow lobes, but just an oscillatory background and a broad angular spectrum originating from the narrow waveguide.

Once the leakage angle obeys the criterion (Eq. 2), the light in the broad waveguide impinging on a facet is reflected back nearly completely. Losses that may occur due to diffraction are small for broad waveguides. Employing the effect of the total internal reflection at the facets allows direct nearly all optical power of the tilted wave from the facet back to the waveguide. This enhances the effects of phase matching and thus enhances the wavelength selectivity. A one skilled in the art will agree that such an enhancement is more pronounced in shorter resonators where the effects of the reflection from the facets play a larger role.

Deposition of a highly reflecting (HR) coat on a read facet of an edge-emitting laser and an anti-reflecting (AR) coat on a front facet of a laser is a common prior art approach. The goal of this approach in the prior art is to reach emission of the laser light from the front facet only and to increase the output optical power emitting through the front facet, which correspondingly increases the differential efficiency of the device.

Figure 10:
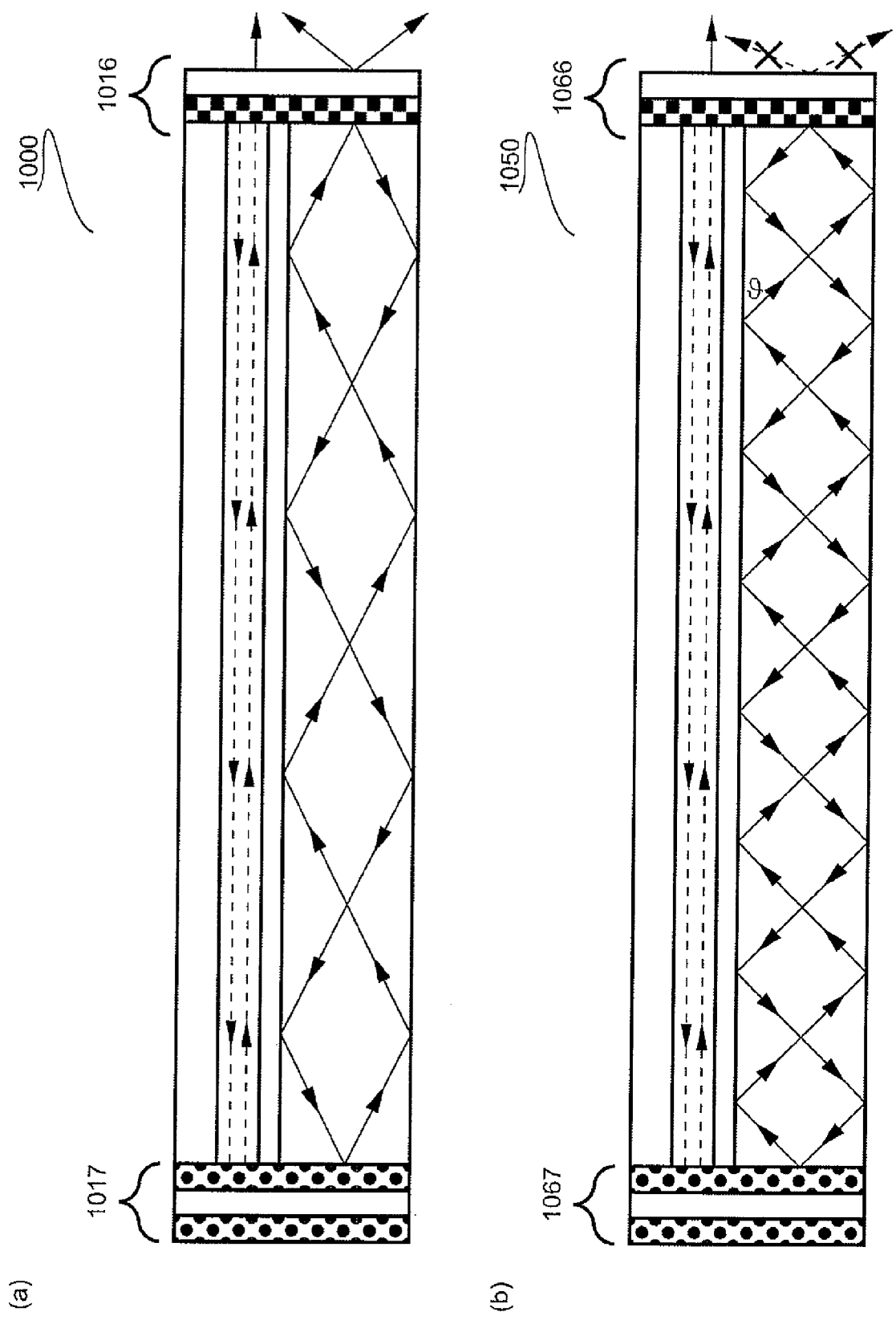
FIG. 10(a) shows schematically a diagram of a tilted wave laser, comprising additionally a highly reflecting (HR) coat on the rear facet and an antireflection (AR) coat on the front facet. Light comes out through the antireflecting coat both from the narrow waveguide and from the broad waveguide.
FIG. 10(b) shows schematically a diagram of a tilted wave laser, comprising additionally a highly reflecting (HR) coat on the rear facet and an antireflection (AR) coat on the front facet. Leakage angle exceeds the angle of the total internal reflection and light does not come out from the broad waveguide.

In a further embodiment of the present invention HR and/or AR coating of a tilted wave laser is employed, as shown schematically in FIG. 10(a). The tilted wave laser (1000) contains an AR coating (1016) on the front facet and a HR coating (1017) on a rear facet. However, the AR coating (1016) plays in a tilted wave laser a different role. The AR coating (1016) is preferably configured such that it minimizes the reflectivity for the specific angle of incidence of light impinging from the broad waveguide on a front facet, namely for the angle equal the leakage angle of the tilted wave in the laser. Then the transmittance of the front facet for the tilted wave impinging from the broad waveguide will be reduced. At the same time the transmittance of the front facet for the wave propagating along the narrow waveguide will be only slightly changed. Such approach will increase the fraction of the emitted optical power in the narrow lobes compared to the emitted optical power in the broad angular spectrum of the narrow waveguide. Possible ways to configure a multilayer coating in order to achieve a desired angular-dependent reflectance of the coating have been taught in the U.S. patent application Ser. No. 10/548,373 "APPARATUS FOR GENERATING IMPROVED LASER BEAM", filed Mar. 10, 2004, by the inventors of the present invention, whereas this patent application is incorporated herein by reference.

Another embodiment of the present invention employs HR and/or AR coating configured such that the wavelength selectivity of the tilted wave laser is substantially increased, and the wavelength-stabilized operation of the tilted wave laser is significantly improved.

A one skilled in the art will appreciate that, if the leakage angle of the tilted wave into the broad waveguide exceeds the angle of the total internal reflection at the semiconductor/interface boundary, adding of an anti-reflecting coat (1066) as well as of a highly reflecting coating (1067) to a tilted wave laser (1050) will not change this fact, and light will still not come out of the broad waveguide, as shown schematically in FIG. 10(b).

Figure 11:
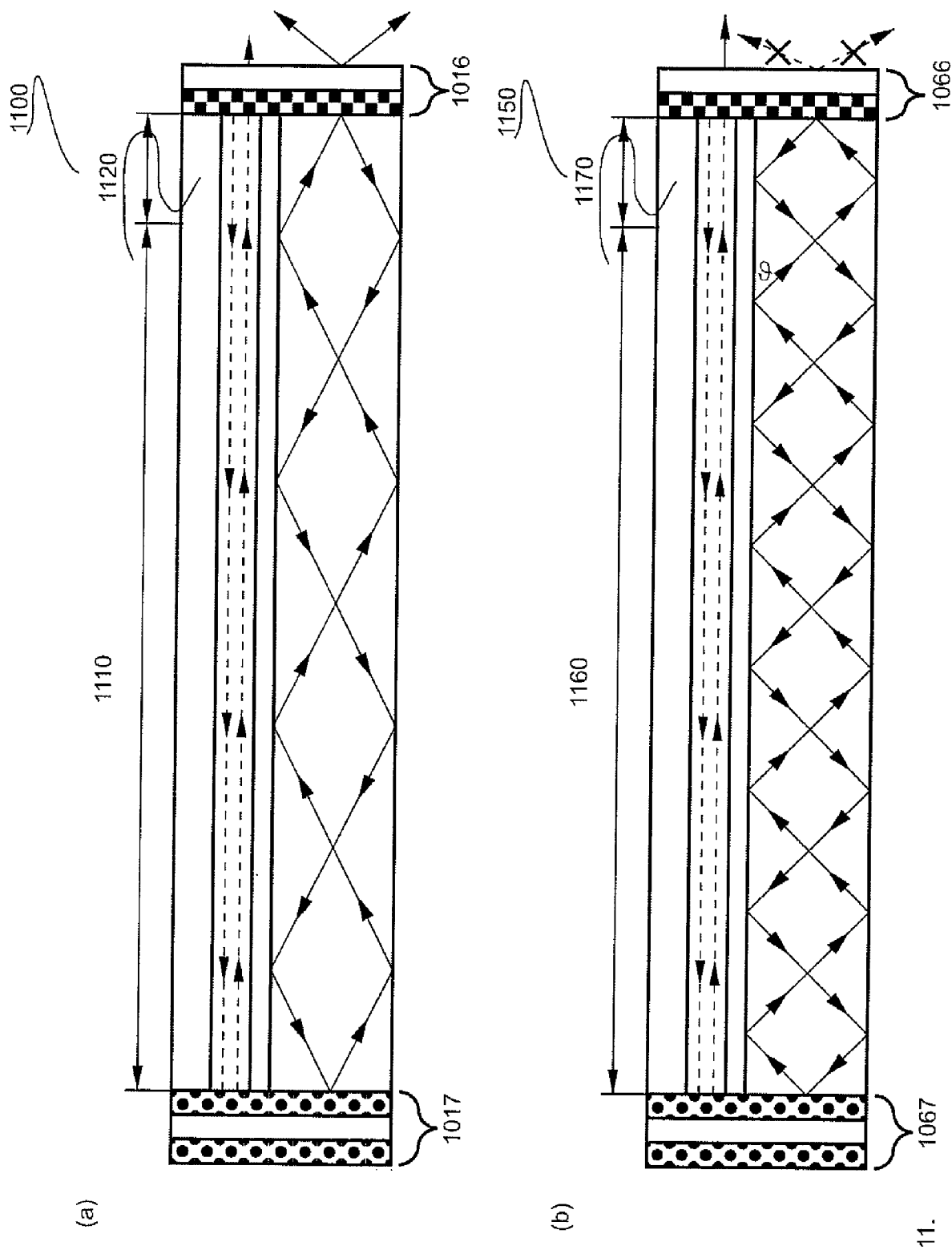
FIG. 11(a) shows schematically a diagram of a tilted wave laser having an umpumped section.
FIG. 11(b) show schematically a diagram of a tilted wave laser having an unpumped section, wherein the leakage angle exceeds the angle of the total internal reflection and no light is coming out from the broad waveguide.

FIG. 11(a) shows schematically a tilted wave laser (1100) according to yet another embodiment of the present invention, the laser comprising, besides a normally pumped section (1110), also one umpumped section (1120) adjacent to the front facet. Putting an unpumped section (1120) close to the front facet results in the fact that the wave travelling along the narrow waveguide towards the exit from the laser is not amplified and may also decay in this section, which reduces the output power emitted from the narrow waveguide in a broad angular spectrum and significantly less affects the output power emitted from the broad waveguide in the narrow lobes.

In a further embodiment of the present invention an unpumped section may be used to improve the wavelength selectivity of the device.

FIG. 11(b) shows schematically a tilted wave laser (1150) according to another embodiment of the present invention, wherein the leakage angle of the tilted wave exceeds the angle of the total internal reflection at the semiconductor/air interface. The laser (1150) comprises, besides a normally pumped section (1160), also an unpumped section (1170). The unpumped section (1170) which serves for enhancement of the wavelength selectivity of the tilted wave laser (1150).

Figure 12:
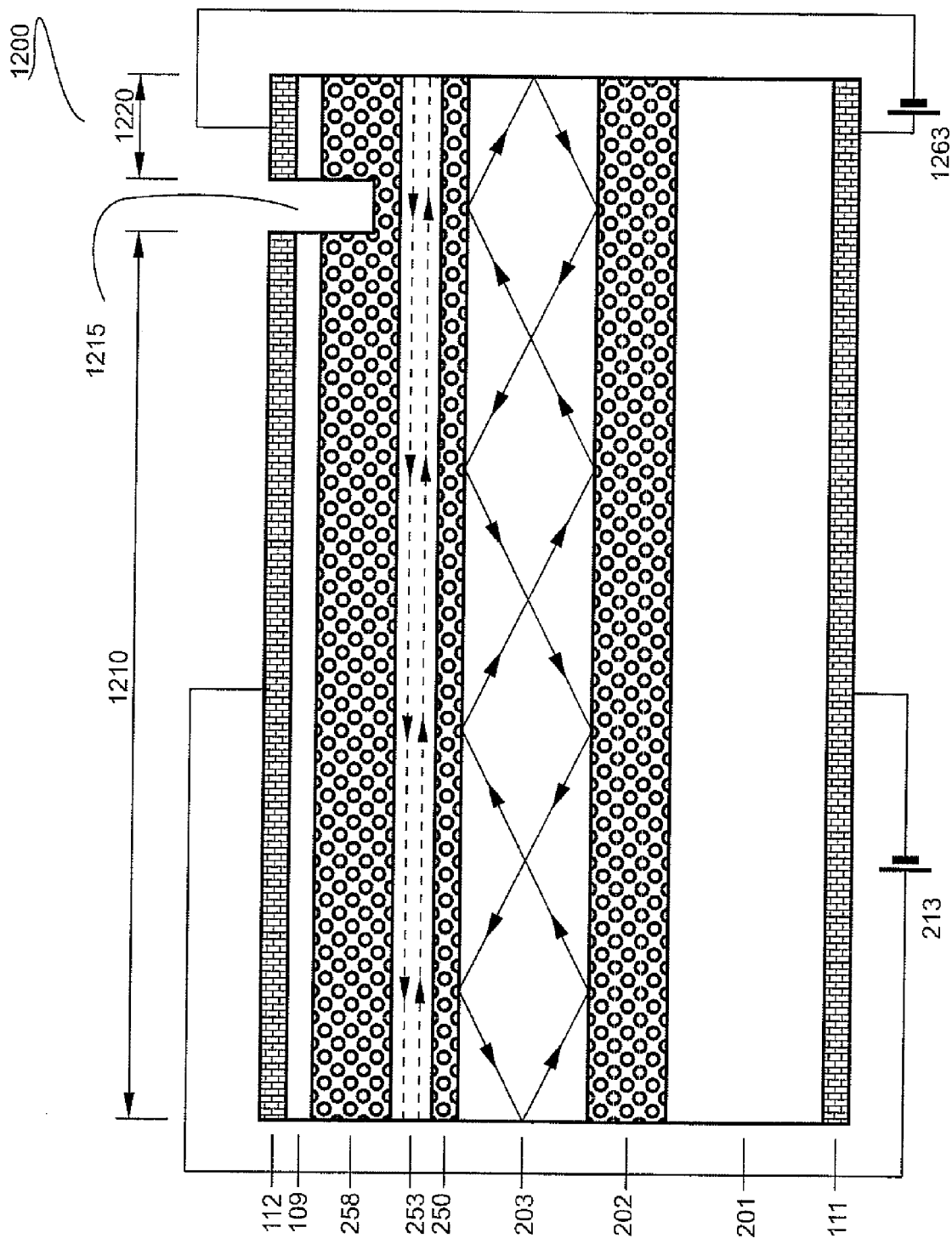
FIG. 12 shows a schematic diagram in more detail of a tilted wave laser having one pumped section and one unpumped section separated by a trench.

FIG. 12 shows schematically a tilted wave laser (1200) according to yet another embodiment of the present invention, wherein a broad waveguide is an epitaxial layer grown on a substrate. The pumped section (1210) and the unpumped section (1220) are separated by a trench (1215). Pumping of the pumped section (1210) is realized by a forward bias (213), whereas the unpumped section (1220) operates under a reverse or zero bias (1263), where no gain is generated in the active region, the latter just operating as an absorber.

Figure 13:
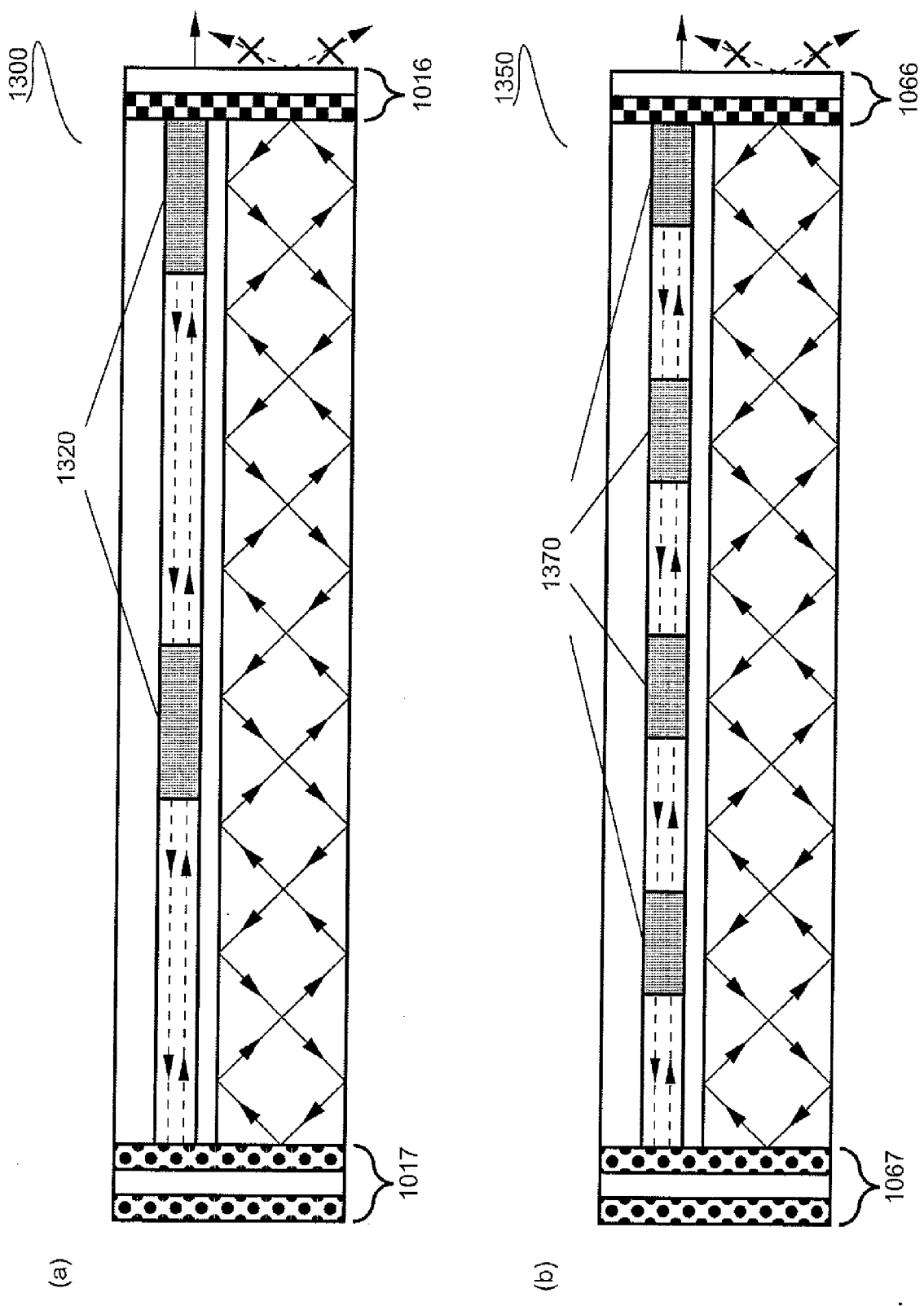
FIG. 13(a) shows a schematic diagram of a tilted wave laser containing two unpumped sections.
FIG. 13(b) shows a schematic diagram of a tiled wave laser containing a periodic pattern of unpumped sections, wherein the period of the pattern of unpumped sections equals the length of the return path of the tilted wave.

In further embodiments of the present invention a tilted wave laser (1300) comprises multiple unpumped sections (1320) as shown schematically in FIG. 13(a).

And in yet another embodiment of the present invention, shown schematically in FIG. 13(b), a tilted wave laser (1350) comprises a periodic structure of unpumped sections (1370).

Figure 14:
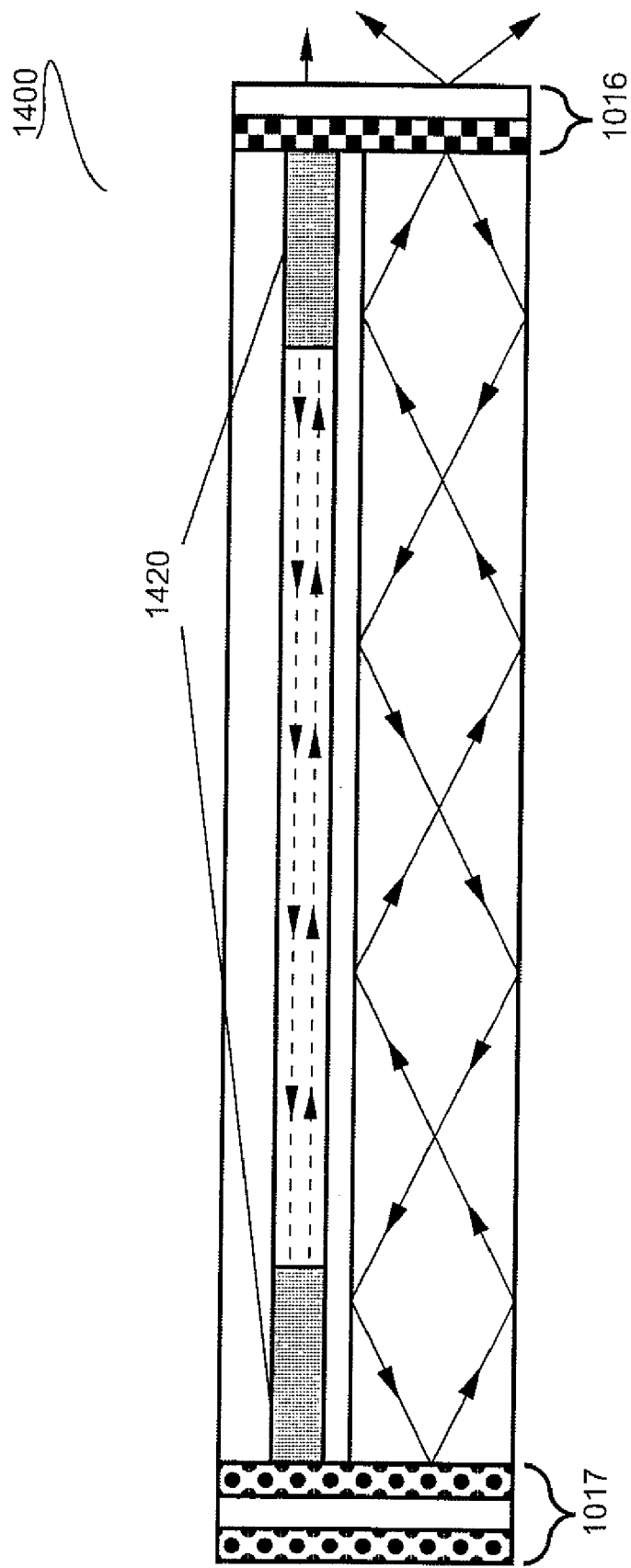
FIG. 14 shows a schematic diagram of a tilted wave laser containing two unpumped sections adjacent to two facets, thus reducing the optical power density at the facet and protecting facets from degradation.

Another advantage of using unpumped section is a possibility to protect the facets of a laser from degradation. Degradation of a laser via the catastrophic optical mirror damage (COMD) occurs if the maximum optical power density at the facet exceeds a certain critical value. This limits the maximum power at continuous wave (cw) operation of a laser. Basically, one can indicate two ways enabling increase the maximum possible output power from a laser. One way is just to improve the material quality. Another way is to reduce the power density keeping the same overall power by using a broad waveguide. A tilted wave laser is particularly suitable for this purpose as the major part of the optical power is concentrated in a tilted wave within the broad waveguide. However, remaining optical power in the narrow waveguide is concentrated over a relatively small thickness and can give a rather high power density causing degradation just at the point where the narrow waveguide meets any of two facets. Using an unpumping section adjacent to one or both facets reduces just the optical power in the narrow waveguide at the facet leaving the optical power in the broad waveguide nearly unchanged. Thus using one or two unpumped section adjacent to facet(s) allows reaching higher output optical power from the tilted wave laser. FIG. 11(a) shows schematically a tilted wave laser having just one unpumped section adjacent to one facet. FIG. 14 shows schematically a tilted wave laser (1400) comprising two unpumped sections (1420) adjacent to both facets.

Figure 15:
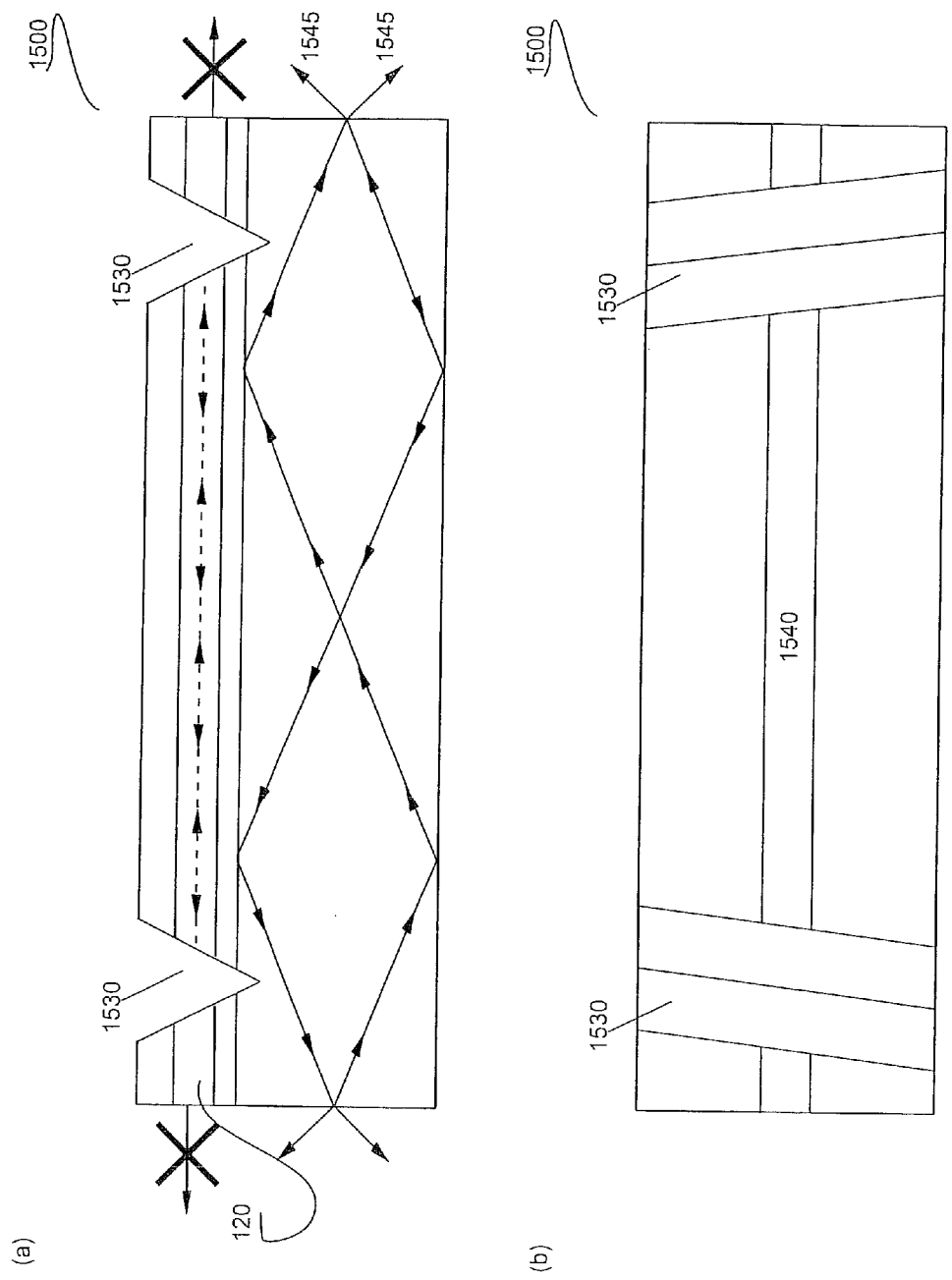
FIG. 15(a) shows a schematic diagram showing the cross-section of the tilted wave laser containing V-grooves that penetrate do deep that they cut the narrow waveguide thus preventing light from coming out from the narrow waveguide.
FIG. 15(b) shows schematically a top view of the tilted wave laser of FIG. 15(a).

FIG. 15(a) shows schematically a tilted wave laser (1500) according to an embodiment of the present invention. A cross section by the vertical longitudinal plane is shown. V-grooves (1530) are introduced such that they intersect the ridge stripe (1540) and penetrate to the depth deeper than the thickness of the narrow waveguide (120). In other words, the narrow waveguide is completely cut. Light propagating along the narrow waveguide is reflected back and partially scattered and cannot come out of the laser. The light propagating in the tilted optical mode comes out from the facet in two narrow vertical lobes (1545).

FIG. 15(b) shows schematically the top view of the same tilted wave laser of FIG. 15(a). The V-grooves in the lateral planes are slightly tilted with respect to the direction perpendicular to the ridge stripe.

One should emphasize that introducing V-grooves destroys a possible feedback for the optical modes localized at the active medium. Therefore, there is mo accumulation of the optical power at the active medium, the stimulated emission lifetime for the localized modes does not shorten, and no lasing in such modes occurs.

In another embodiment of the present invention V-grooves are directed perpendicular to the ridge stripe.

In yet another embodiment of the present invention, the laser has only one groove close to one of the facets.

In a further embodiment of the present invention, the laser contains a V-groove close to one facet, and the other facet is covered by a highly reflecting coating.

In another embodiment of the present invention, the grooves have a shape in the cross section different from the V-grooves The grooves can have a rectangular or a rounded shape, or any combination of the simple shapes.

In yet another embodiment of the present invention, multiple grooves are introduced close to one of the facets.

In a further embodiment of the present invention, multiple grooves are introduced close to each of the both facets.

In another embodiment of the present invention, a facet opposite to the narrow waveguide is cleaved in a tilted direction such that no feedback occurs for the light propagating along the narrow waveguide.

In yet another embodiment of the present invention, a facet opposite to the narrow waveguide is treated in such a way that the surface becomes rough, i.e. by selective etching or scribing, and no feedback for the light propagating along the narrow waveguide occurs.

In a further embodiment of the present invention, a tilted wave laser comprises multiple ridge stripes. Then the grooves should preferably intersect most of the stripes to suppress the lasing from the narrow waveguide.

Figure 16:
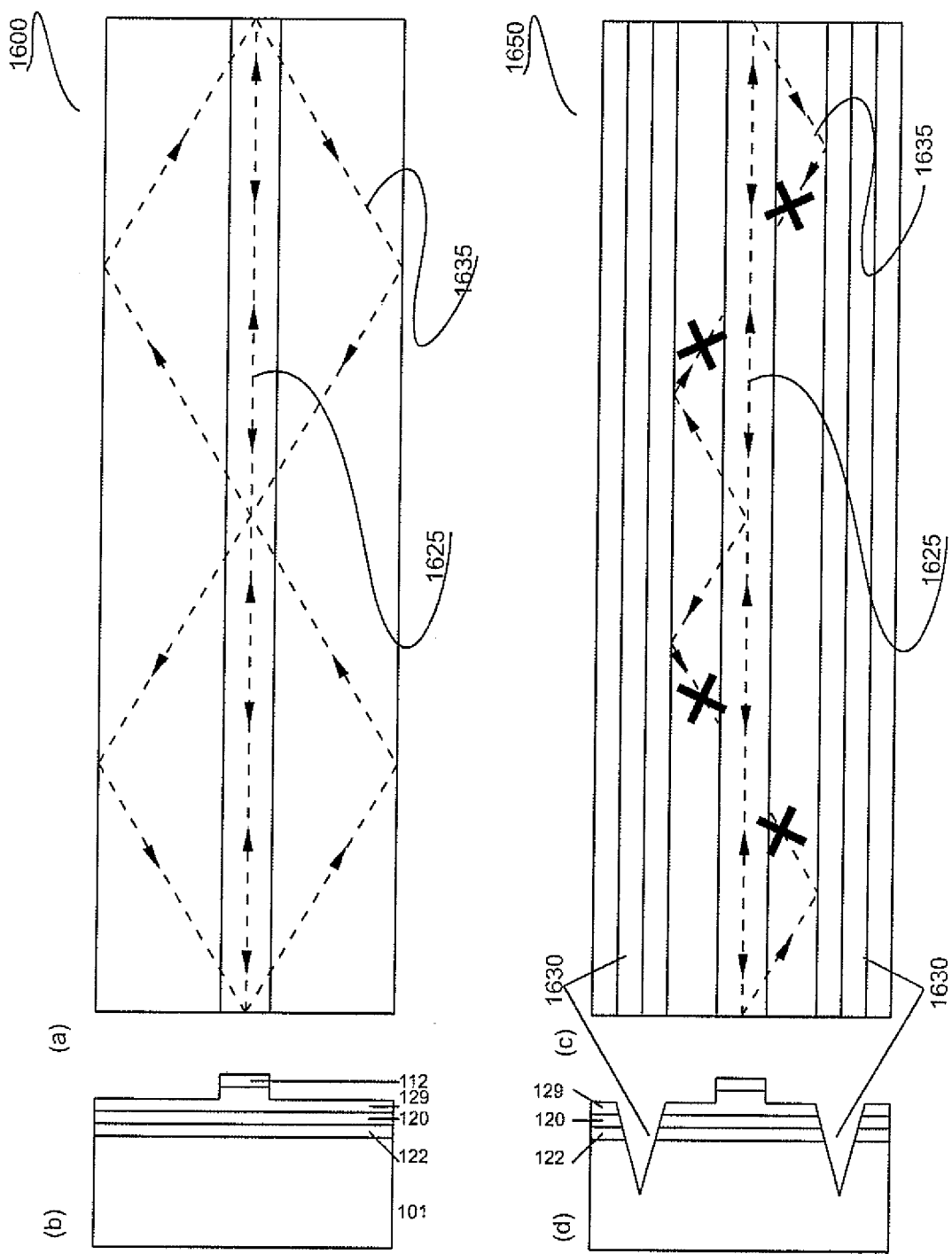
FIG. 16(a) shows a schematic diagram showing a top view of a tilted wave laser showing, along with the lateral mode propagating along the ridge stripe also a parasitic closed lateral mode.
FIG. 16(b) shows schematically the cross section in the vertical transversal plane of the same tilted wave laser as in FIG. 16(b).
FIG. 16(c) shows a schematic diagram showing a top view of a tilted wave laser further comprising grooves parallel to the ridge stripe, wherein the grooves suppress the reflection of the light in a parasitic closed lateral mode such that no feedback occurs for such parasitic modes.
FIG. 16(d) shows schematically the cross section in the transversal vertical plane of a tilted wave laser of FIG. 16(c) showing V-grooves penetrating in the depth over a significant part of the broad waveguide.

FIGS. 16(a) through 16(d) demonstrate another embodiment of the present invention. Since a tilted wave laser (1600) contains a broad vertical waveguide, the vertical optical modes are extended over a large thickness, and the optical confinement factor of the vertical mode in the active region is rather small. This fact reduces both the modal gain of the vertical optical mode in those parts of the device where the active region is pumped and the modal absorption loss of the vertical optical mode in those parts of the device where the active region is unpumped and therefore absorbing. Due to small losses, there can exist multiple lateral optical modes (1625), (1635) propagating in the unpumped parts of the device, including closed lateral optical modes one of which (1635) is shown in FIG. 16(a). FIG. 16(b) shows the view from the facet or a cross section view in the vertical plane perpendicular to the ridge stripe.

FIGS. 16(c) and 16(d) show schematically a tilted wave laser (1650) according to an embodiment of the present invention. In order to suppress parasitic lateral modes(1635), deep V-grooves (1630) are introduced. The grooves shown in FIG. 16(c) are directed parallel to the ridge stripe. The cross section of the structure presented in FIG. 16(d) shows that the V-grooves (1630) are indeed really deep and penetrate in the depth over about one half of the thickness of the broad waveguide. The depth is important to ensure efficient scattering of the tilted wave (1635) travelling in the lateral plane and impinging on the V-groove. Thus the depth should be preferably larger than one quarter of the thickness of the broad waveguide. Since in the present embodiment the substrate is used for the broad waveguide, it is not possible to form a groove cutting the entire waveguide in the depth as the device would lose its mechanical integrity.

In yet another embodiment of the broad waveguide, the broad waveguide is realized as an epitaxial layer grown on a substrate. Then it is possible to form a deep V-groove cutting the entire broad waveguide in the depth.

In a further embodiment of the present invention, the V-grooves are directed in the lateral plane not parallel but at some tilt angle with respect to the ridge stripe. It is important however, that these deep grooves do not intersect the stripe.

In another embodiment of the present invention, no deep grooves are formed but the side surfaces of the device are made rough by scribing or etching such that no feedback occurs for parasitic closed lateral optical modes.

In yet another embodiment a tilted wave laser comprise multiple ridge stripes. Then the deep grooves preferably should not intersect the major part of the stripes to allow the tilted optical wave propagate in the broad waveguide without additional scattering.

Further embodiments of the present invention are related to the specific configuring the tilted wave laser in the longitudinal direction. In order to consider the behavior of the tilted optical wave, one should note that the spatial periodicity of the oscillations of the optical wave in the vertical direction equals $$\frac{\lambda}{n^{broadWG} \times \sin\vartheta_{leakage}}. \quad \text{(Eq. 3)}$$

For typical leakage angles $\vartheta_{leakage} > 8°$, the wavelength of light in the vacuum $\lambda \approx 1$ μm, and the refractive index $n^{broad\ WG} \approx 3.5$, Eq. 3 yields 2 μm. Thus, for the thickness of the broad waveguide 20 μm and more (for the epitaxial waveguide) and for typical thickness of the substrates the optical wave exhibits in the broad waveguide a large number of oscillations in the vertical direction. This allows using the approximation of the geometrical optics (or ray optics) and considering the propagation of light in the broad waveguide as propagation of rays.

To match the optical field in the broad waveguide and in the narrow waveguide, the approach of the wave optics is needed. For transverse electric (TE) optical mode, the Maxwell's equations reduce to the scalar equation for y-component of the electric field, $$-\frac{d^2 E_y(x,z)}{dz^2} - \frac{d^2 E_y(x,z)}{dx^2} - \varepsilon(z)\left(\frac{2\pi}{\lambda}\right)^2 E_y(x,z) = 0, \quad \text{(Eq. 4)}$$

where $\in(z)$ is the dielectric function. For an infinite waveguide one seeks the solution in the following form, $$E_y(x,z) = \exp(i\beta x) \times \tilde{E}(z). \quad \text{(Eq. 5)}$$

Figure 17:
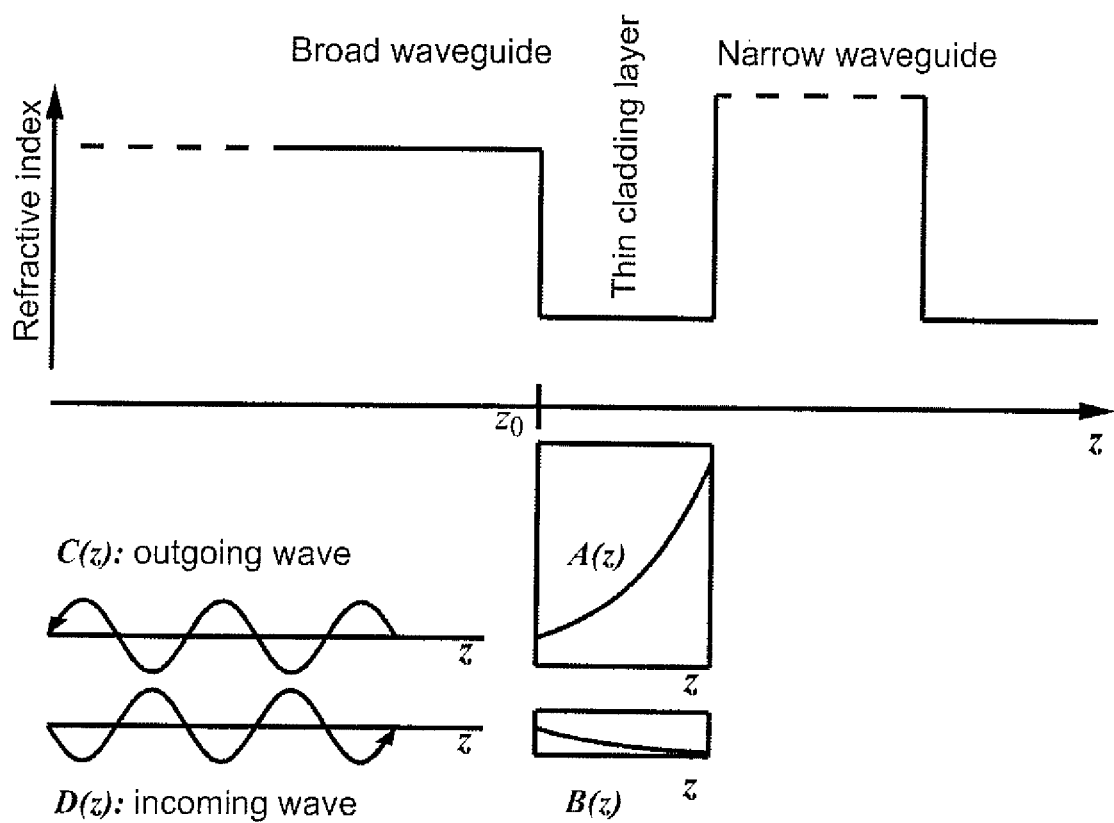
FIG. 17 shows a schematic diagram showing the refractive index profile and separate optical waves forming the optical field profile in the thin cladding layers coupling both waveguides and in the broad waveguide.

The z-dependent amplitude in the thin cladding layer in FIG. 17 is a linear combination of an exponentially increasing and exponentially decaying function, $$\tilde{E}_y(z) = A \exp[p(z-z_0)] + B \exp[-p(z-z_0)], \quad \text{(Eq. 6a)},$$

and this amplitude in the broad waveguide is a linear combination of the outgoing and incoming wave, $$\tilde{E}_y(z) = C \exp[-iq(z-z_0)] + D \exp[iq(z-z_0)]. \quad \text{(Eq. 6b)}$$

The boundary conditions at the boundary at $z=z_0$ require the continuity of the electric field and its derivative. These allow to exclude the coefficient B and obtain the relationship between the rest three amplitudes, $$2A = \left(1 - \frac{iq}{p}\right)C + \left(1 + \frac{iq}{p}\right)D. \quad \text{(Eq. 7)}$$

In a resonator having a finite length, the amplitudes A, C, D vary slowly along the x-direction on a scale exceeding the wavelength of light.

The thickness of the thin cladding layer is assumed to be sufficient such that the optical mode within the narrow waveguide is well defined. It implies that, the second term on the right hand side of (Eq. 6a) decays significantly in the cladding layer and becomes negligibly small at the boundary between the thin cladding layer and the narrow waveguide.

Then, the amplitude A is clearly proportional to the amplitude of the optical mode in the narrow waveguide. Therefore, a slow variation of this amplitude along the resonator can be written as a sum of the contribution of the gain in the gain medium, internal loss in the narrow waveguide, leakage from the narrow waveguide into the broad waveguide and return from the broad waveguide back to the narrow waveguide, $$\frac{d}{dx}|A(x)|^2 = [g_{modal} - \alpha_{int}]|A(x)|^2 - K[|C(x)|^2 - |D(x)|^2]. \quad \text{(Eq. 8)}$$

To elucidate the physical meaning of the coefficient K it is worth considering temporarily the situation where the leaked wave does not return back to the narrow waveguide, and D≡0. Then, substituting C from (Eq. 7) into (Eq. 8) yields $$\frac{d}{dx}|A(x)|^2 = [g_{modal} - \alpha_{int}]|A(x)|^2 - \left|\frac{2}{1-\frac{iq}{p}}\right|^2 K|A(x)|^2. \quad \text{(Eq. 9)}$$

It follows from (Eq. 9) that the last coefficient has a meaning of the leakage loss, $\alpha_{leakage}$. In the tilted wave laser, where light leaked to the broad waveguide returns back to the narrow waveguide, this quantity does not mean indeed losses, but just a measure of coupling between two waveguides. Now, expressing K in terms of $\alpha_{leakage}$, further expressing C in terms of A and D from (Eq. 7), one transforms (Eq. 9) as follows, $$\frac{d}{dx}|A(x)|^2 = [g_{modal} - \alpha_{int}]|A(x)|^2 - \alpha_{leakage}\left[|A(x)|^2 - \frac{p+iq}{2p}A(x)D^*(x) - \frac{p-iq}{2p}A^*(x)D(x)\right] \quad \text{(Eq. 10)}$$

A significant simplification of (Eq. 10) is possible since the amplitude A(x) is essential a real function as an oscillating factor exp(iβx) is already excluded. Then (Eq. 11) reduces to a linear equation $$\frac{d}{dx}A(x) = \frac{[g_{modal} - \alpha_{int}]}{2}A(x) - \frac{\alpha_{leakage}}{2}\left[A(x) - \frac{p+iq}{2p}D^*(x) - \frac{p-iq}{2p}D(x)\right] \quad \text{(Eq. 11)}$$

Equation (Eq. 11) is a linear differential equation containing a non-local term related to the tilted wave returning from the broad waveguide to the narrow waveguide. The non-local term occurring at a point $x_0$ is related to the tilted wave generated at a different point x'.

In FIG. 17(a), a return path of the tilted wave in the broad waveguide is shown between the point x' and the point $x_0$, and the length of the return path $L_{return}$. The global behavior of the tilted wave in the coupled resonator is determined by the relationship between the length of the return path of the tilted wave and the length of the resonator. FIG. 10(a) shows a structure, in which $$L_{return} < L_{resonator}. \quad \text{(Eq. 12a)}$$

Then light leaked from the narrow waveguide into the broad waveguide will either return to the narrow waveguide or be first reflected from a facet. However, once reflected from a facet, the light in the tilted wave will necessarily return to the narrow waveguide before it meets another facet. Thus, between two events of the reflection from facets, the light in the tilted wave comes necessarily to the narrow waveguide at least once.

FIG. 17(b) shows an opposite situation, where $$L_{return} > L_{resonator}. \quad \text{(Eq. 12b)}$$

Then light in the tilted wave in the broad waveguide reflected from a facet may either first come to the narrow waveguide or be reflected from another facet. However, once leaked from the narrow waveguide to the broad waveguide, the light will necessarily be reflected from a facet before it returns to the narrow waveguide. Thus, between two events of hitting the narrow waveguide, the light in the tilted wave is necessarily reflected from at least one of the facets at least once.

Figure 8:
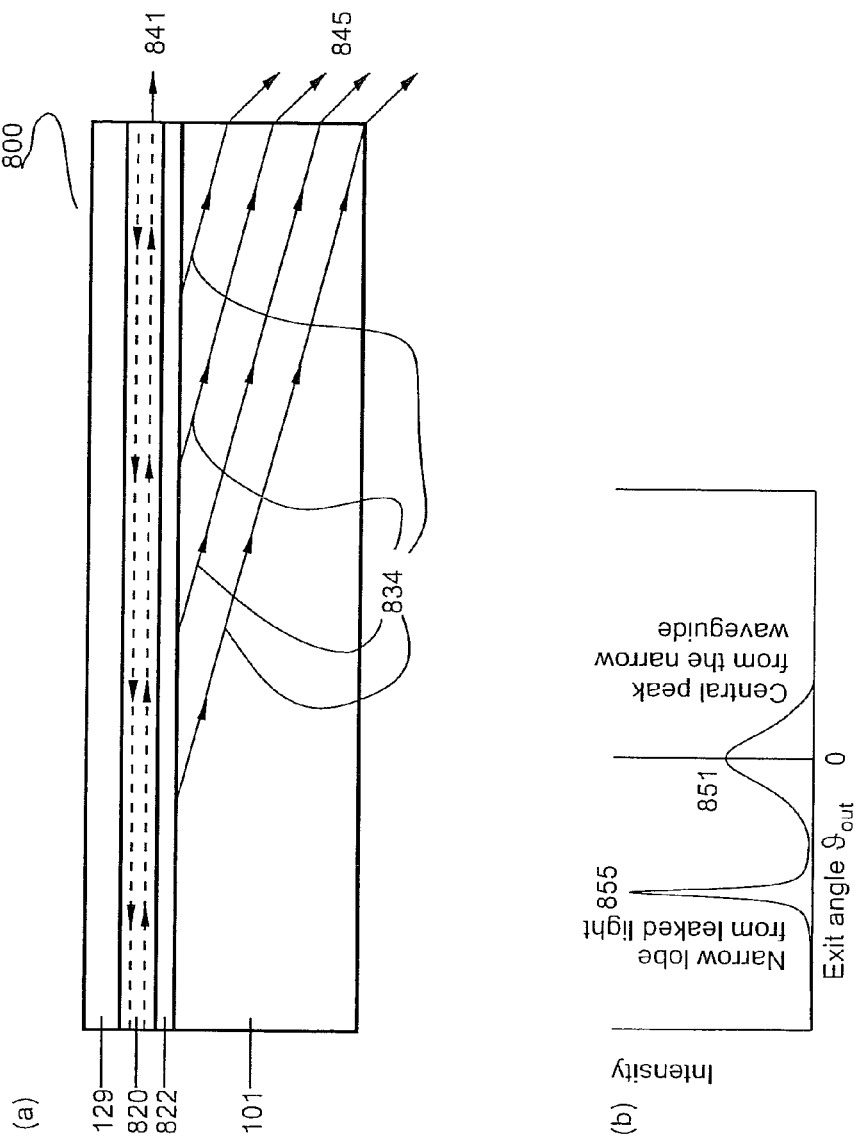
FIG. 8(a) shows a schematic diagram of a laser operating as a leaky laser, wherein no light is reflected back from the back surface of the substrate.
FIG. 8(b) shows schematically the far field pattern of the leaky laser of FIG. 8(a) revealing a single narrow lobe related to the leaky light and a broad central angular spectrum related to the light coming out from the narrow waveguide.

The length of the return path of the tilted wave may be easily written in terms of the thickness of the broad waveguide and the leakage angle. It follows from FIGS. 8(a) and 10(a) that $$L_{return} = 2H \cot \vartheta_{leakage}. \quad \text{(Eq. 13)}$$

For the typical values of $\vartheta_{leakage}$=8° and H=20 μm, (Eq. 13) yields $L_{return}$=0.28 mm For the case, where a substrate serves as a broad waveguide and H=100 μm, (Eq. 13) yields $L_{return}$=1.42 mm.

For a larger leakage angle, $\vartheta_{leakage}$=20° and H=20 μm, (Eq. 13) yields $L_{return}$=0.11 mm. For the case, where a substrate serves as a broad waveguide and H=100 μm, (Eq. 13) yields $L_{return}$=0.55 mm.

These estimates show that the length of the return path is of the same order of magnitude as resonator lengths in edge-emitting lasers ranging typically between 0.5 mm and 2 mm. Thus, both the case of (Eq. 12a) and the case of (Eq. 12b) are practically possible. In what follows the focus will be given only on a more frequent situation where the length of the return path of the tilted wave is shorter than the length of the resonator (see (Eq. 12a)).

Figure 19:
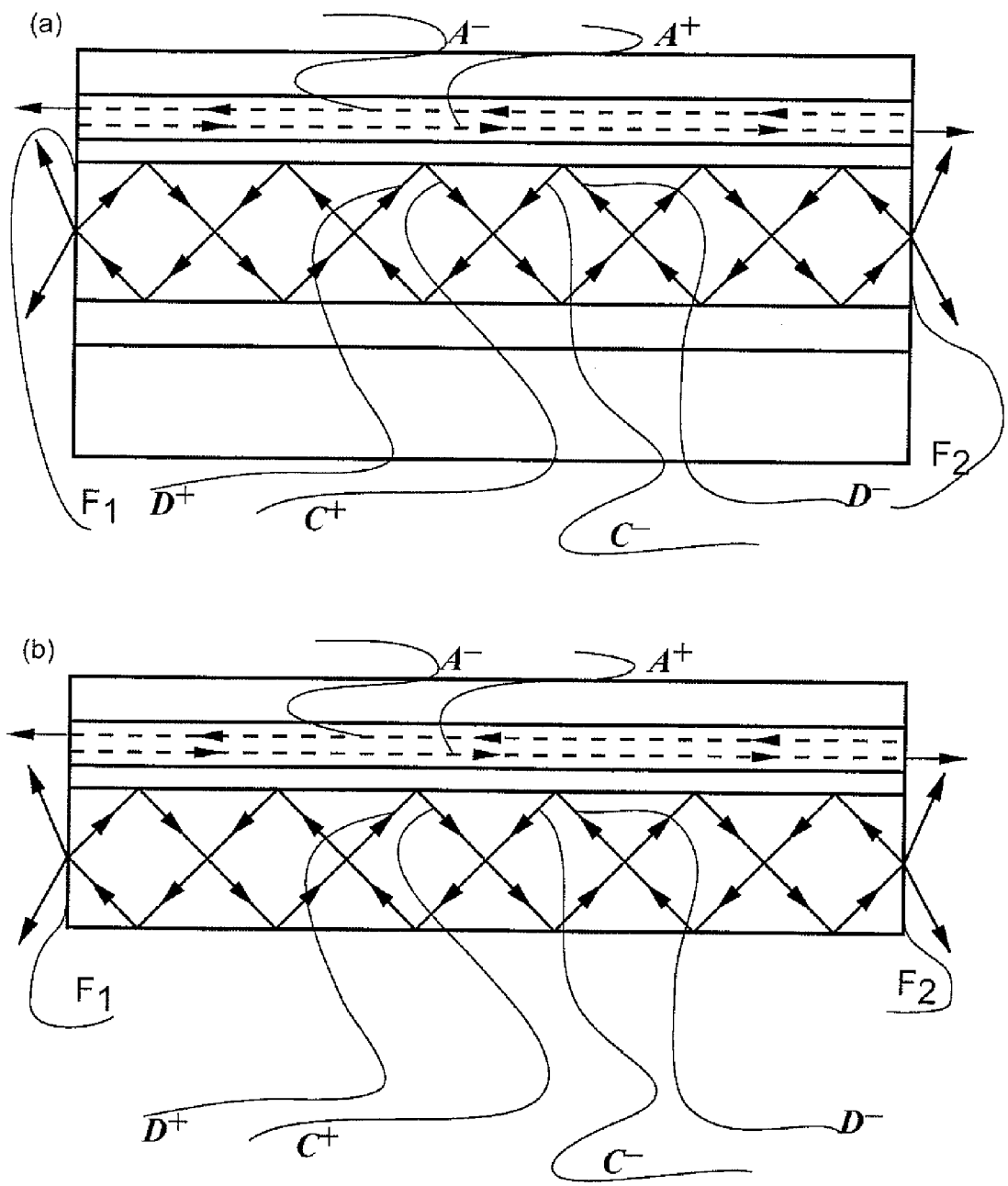
FIG. 19(a) shows a schematic diagram showing schematically different contributions to the optical field. The superscript "+" refers to the optical waves propagating from the facet F1 to the facet F2, and the superscript "−" refers to the optical waves propagating in the opposite direction. Notations A, C, and D correspond to those in FIG. 9. The broad waveguide is realized as a waveguide grown epitaxially on a substrate.
FIG. 19(b) shows a schematic diagram showing different contributions to the optical field within the structure, wherein the substrate is employed as a broad waveguide.

The complete profile of the optical mode within a tilted wave laser includes waves travelling in both opposite longitudinal directions. FIG. 19(a) shows schematically the waves travelling in both the positive x-direction, from the facet $F_1$ to the facet $F_2$ marked with the "+" sign and the negative "x"-direction, from the facet $F_2$ to the facet $F_1$ marked with the "−" sign. The wave travelling in the narrow waveguide in the positive x-direction is marked $A^+$. The wave travelling in the narrow waveguide in the negative x-direction is marked $A^-$. Light travelling in broad waveguide obeys, with a high accuracy, laws of the geometrical optics and may be described as rays. Rays outgoing from the boundary between the thin cladding layer coupling two waveguides into the broad waveguide, travelling in the positive x-direction are marked $C^+$. Rays outgoing from the boundary between the thin cladding layer coupling two waveguides into the broad waveguide, travelling in the negative x-direction are marked $C^-$. Rays impinging from the broad waveguide onto an interface between the broad waveguide and the cladding layer coupling the two waveguides, rays travelling in the positive x-direction are marked $D^+$. Rays impinging from the broad waveguide onto an interface between the broad waveguide and the cladding layer coupling the two waveguides, rays travelling in the negative x-direction are marked $D^-$.

Figure 18:
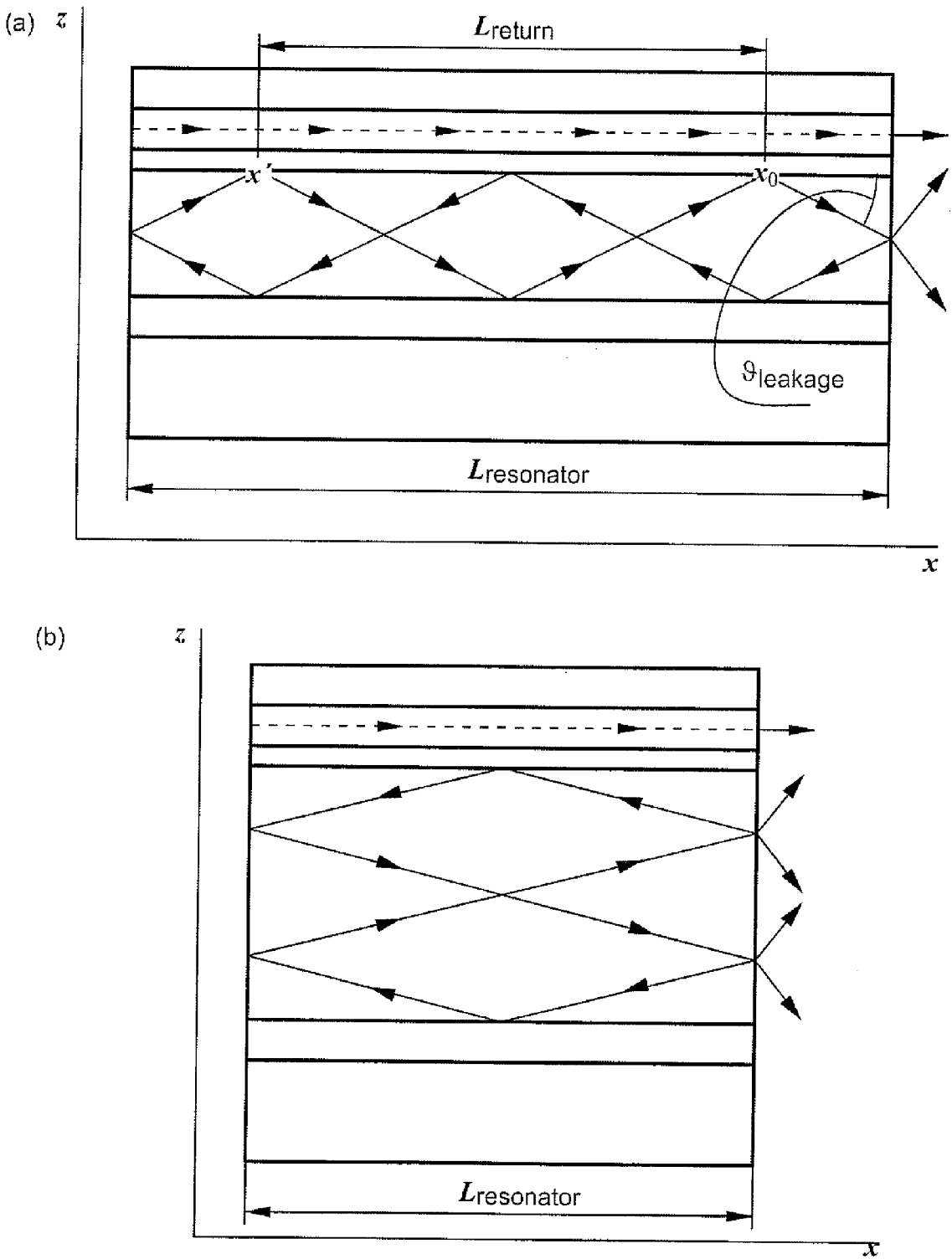
FIGS. 18(a) and 18(b) show schematically the tilted wave lasers and corresponding tilted waves in the structures having different relationship between the length of the return path of the tilted wave and the length of the resonator.

FIG. 19(b) shows schematically the waves travelling in the tilted wave laser, wherein a substrate is employed as a broad waveguide. The essential contributions to the optical field are the same as in the structure of FIG. 18(a), wherein the broad waveguide is a löayer grown epitaxially on a substrate.

FIGS. 20(a) through 20(d) illustrates all possible geometrical paths of the rays in the broad waveguide, which go from the top boundary of the broad waveguide, i.e. from the interface between the broad waveguide and the cladding layer coupling the two waveguides, are reflected from the bottom boundary of the broad waveguide, are or are not reflected from one of the facets and return back to the top boundary of the broad waveguide. Four different cases are possible.

Figure 20:
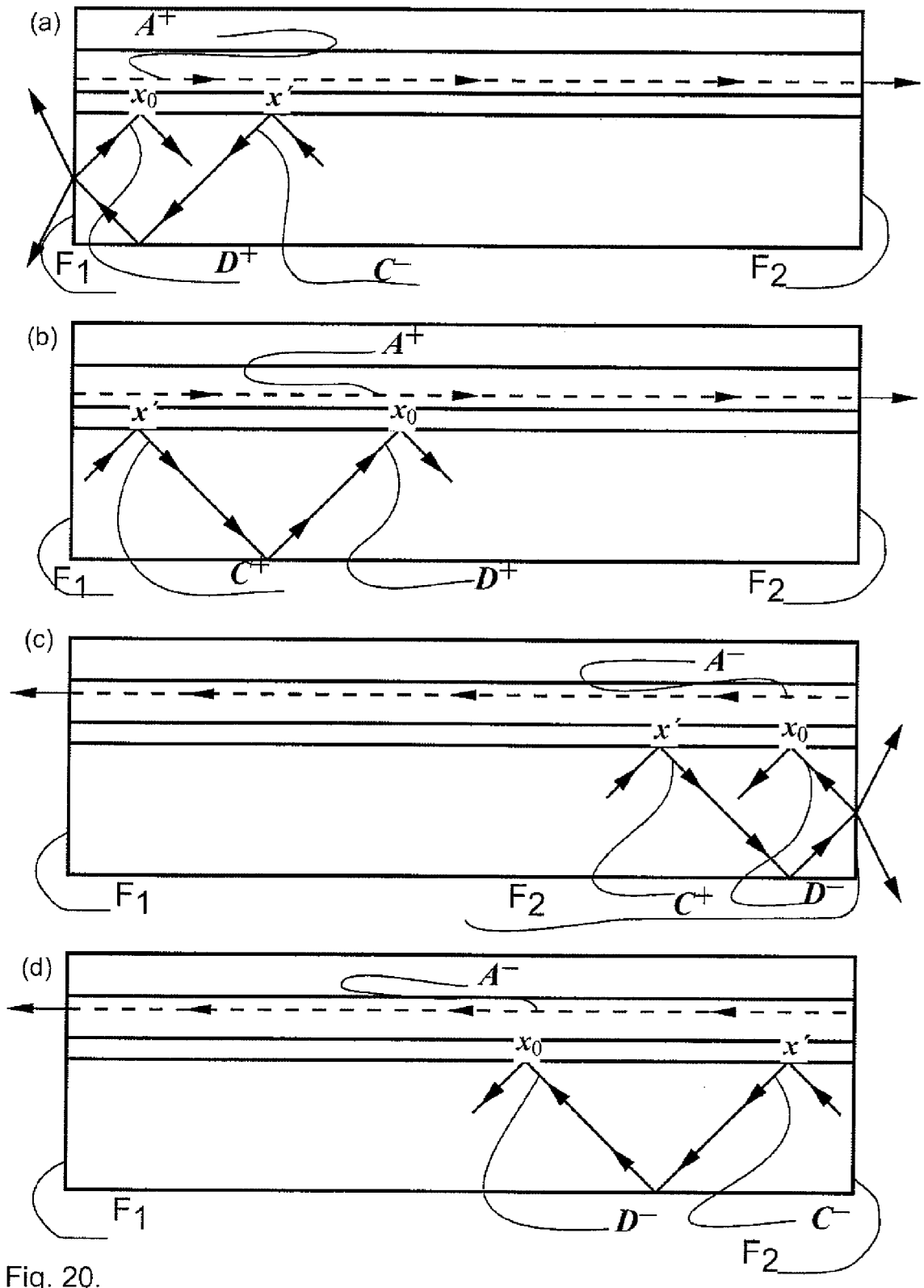
FIGS. 20(a) through 20(d) illustrate the relationship between the point x', where the tilted wave leaks from the narrow waveguide into the broad waveguide, and the point $x_0$, where the tilted wave returns back from the broad waveguide into the narrow waveguide.

FIG. 20(a) illustrates a ray travelling away from the top boundary of the broad waveguide in the negative x-direction, reflected back from the facet $F_1$ and impinging back onto the top boundary of the broad waveguide. The amplitudes of the waves outgoing from the cladding layer to the broad waveguide and incoming back to the cladding layer are related as follows:

$$D^+(x_0) = r_1^{broad\ WG} \exp(i\Phi)\exp(-\gamma)C^-(x'), \quad \text{(Eq. 14a)}$$

where $0 \leq x_0 \leq L_{return}$, and $x' = L_{return} - x_0$.

The phase $\Phi$ is the phase change due to ray propagation along the tilted path shown in FIG. 20(a) from the point x' on the top boundary of the broad waveguide down to the bottom boundary and back to the top boundary, the phase also including the phase change due to the reflection from the bottom boundary of the broad waveguide. The attenuation factor $\exp(-\gamma)$ describes the decay of the optical field due to the absorption in the broad waveguide and due to the scattering at the bottom boundary. $r_1^{broad\ WG}$ is the reflectivity of the tilted wave in the broad waveguide from the facet $F_1$. Attenuation of the optical field due to deviation from the geometrical optics and diffraction at the facet $F_1$ is included in the reflectivity coefficient $r_1^{broad\ WG}$.

FIG. 20(b) illustrates a ray travelling away from the top boundary of the broad waveguide in the positive x-direction and impinging back onto the top boundary of the broad waveguide, incurring no reflection from any facet on its way. The amplitudes of the waves outgoing from the cladding layer to the broad waveguide and incoming back to the cladding layer are related as follows:

$$D^+(x_0) = \exp(i\Phi)\exp(-\gamma)C^+(x'), \quad \text{(Eq. 14b)}$$

where $L_{return} \leq x_0 \leq L_{resonator}$, and $x' = x_0 - L_{return}$.

FIG. 20(c) illustrates a ray travelling away from the top boundary of the broad waveguide in the positive x-direction, reflected back from the facet $F_2$ and impinging back onto the top boundary of the broad waveguide. The amplitudes of the waves outgoing from the cladding layer to the broad waveguide and incoming back to the cladding layer are related as follows:

$$D^-(x_0) = r_2^{broad\ WG} \exp(i\Phi)\exp(-\gamma)C^+(x'), \quad \text{(Eq. 14c)}$$

where $L_{resonator} - L_{return} \leq x_0 \leq L_{resonator}$, and $x' = 2L_{resonator} - x_0 - L_{return}$; $r_2^{broad\ WG}$ is the reflectivity of the tilted wave in the broad waveguide from the facet $F_2$.

Finally, FIG. 20(d) illustrates a ray travelling away from the top boundary of the broad waveguide in the negative x-direction and impinging back onto the top boundary of the broad waveguide, incurring no reflection from any facet on its way. The amplitudes of the waves outgoing from the cladding layer to the broad waveguide and incoming back to the cladding layer are related as follows:

$$D^-(x_0) = \exp(i\Phi)\exp(-\gamma)C^-(x'), \quad \text{(Eq. 14d)}$$

where $0 \leq x_0 \leq L_{resonator} - L_{return}$, and $x' = x_0 + L_{return}$.

A one skilled in the art will appreciate that the optical wave propagating along the narrow waveguide and impinging on a facet is reflected back irrespectively of the presence of the broad waveguide and the corresponding reflectivity is the same as in a conventional edge-emitting laser having the same narrow waveguide. The corresponding relationship reads:

$$A^+(0) = r_1^{narrow\ WG} A^-(0), \quad \text{(Eq. 15a)}$$

and $$A^-(L_{return}) = r_2^{narrow\ WG} A^+(L_{return}). \quad \text{(Eq. 15b)}$$

Here $r_1^{narrow\ WG}$ and $r_2^{narrow\ WG}$ are the reflectivity of the light propagating in the narrow waveguide, from the facets $F_1$ and $F_2$, respectively.

The differential equation (Eq. 11) should be extended to describe separately the waves propagating in the positive and negative x-direction, $$\frac{d}{dx}A^+(x) = \frac{[g_{modal} - \alpha_{int}]}{2}A^+(x) - \quad \text{(Eq. 16a)}$$
$$\frac{\alpha_{leakage}}{2}\left[A^+(x) - \frac{p+iq}{2p}D^{+*}(x) - \frac{p-iq}{2p}D^+(x)\right],$$

and $$-\frac{d}{dx}A^-(x) = \frac{[g_{modal} - \alpha_{int}]}{2}A^-(x) - \quad \text{(Eq. 16b)}$$
$$\frac{\alpha_{leakage}}{2}\left[A^-(x) - \frac{p+iq}{2p}D^{-*}(x) - \frac{p-iq}{2p}D^-(x)\right].$$

The set of equations from (Eq. 14a) through (Eq. 16b) extends conventional equations for the optical waves at the lasing threshold for an edge-emitting laser, wherein the threshold criterion reads that the amplification of the optical wave on a double path forth and back along the waveguide, occurring due to gain in the active medium just compensates losses including internal losses and losses due to emission from the facets.

For a structure of two coupled tilted wave resonators, the corresponding set of equations describing the lasing threshold is much more complicated. The main complication originates from the non-local terms in the equations, where light leaked from the narrow waveguide at a point x', returns back to the narrow waveguide, after only a moderate decay, at a different point $x_0$. A one skilled in the art will appreciate that the set of equations from (Eq. 14a) through (Eq. 16b) can be written as a set of algebraic equations in the finite difference approach, and the whole problem will then reduce to a matrix eigenvalue and eigenvector problem. Then the threshold modal gain can be obtained as the minimum real eigenvalue of this matrix, and the corresponding eigenvector will describe the longitudinal profile of the optical field amplitude.

The calculated threshold modal gain is a function of the wavelength of light. Due to a phase factor $\exp(i\Phi)$ in (Eq. 14a) through (Eq. 14d), the threshold modal gain is an oscillating function of the wavelength. The threshold modal gain reaches its minimum value at a wavelength, at which the phase matching conditions, modified due to a finite resonator length in the longitudinal direction, are met. As a function of the wavelength, the threshold modal gain may have multiple local minima defining a set of selected optimum wavelengths. This optimum wavelength, or these optimum wavelengths demonstrate the wavelength-stabilized operation of the tilted wave laser.

Once the threshold modal gain is found, the corresponding longitudinal profile of the optical field, namely the longitudinal profiles of the functions $A^+(x), A^-(x), C^+(x), C^-(x), D^+(x),$ and $D^-(x)$ determine also the relationship between the optical power emitted in a broad angular spectrum from the narrow waveguide and the optical power emitted in two narrow lobes from the broad waveguide. Thus, by selection the preferred length of the resonator, it is possible to control both the wavelength-stabilized operation of the device and the far field pattern.

Due to non-local nature of tilted wave propagation in a coupled tilted wave resonator, certain special cases are possible, where a ray corresponding to a tilted wave in the broad waveguide forms a closed loop. This occurs if the resonator length equals the length of the return path of the tilted wave multiplied by a rational number, $$\frac{L_{resonator}}{L_{return}} = \frac{k}{m}, \qquad \text{(Eq. 17)}$$

where k and m are integer numbers.

Any one skilled in the art will appreciate that, given the precision, every real number can be approximated by some rational number. However, there are two limitations. First, the approximation of the geometrical optics is valid only as long as all spatial dimensions involved are significantly larger than the wavelength of light in the medium. Second, and even more important, is that after a large number of paths and/or reflections, the optical wave decays, due to absorption in the broad waveguide described by the attenuation factor exp(−γ) in Eqs. (Eq. 14a) through (Eq. 14d) as well as by diffraction at every reflection event. Therefore, the effects of closed loops are smeared out, if the numerator and/or denominator in (Eq. 17) is rather large. Thus, it is clear that if the fraction on the right hand side is, say, ½, the effects of the closed loop should be well pronounced, whereas, if the fraction equals, say, 37/11, these effects will be likely smeared out. In practical structures, effects of closed loops can be visible, if both integer numbers "k" and "m" in (Eq. 17) are mutually prime numbers and both do not exceed six.

Figure 21:
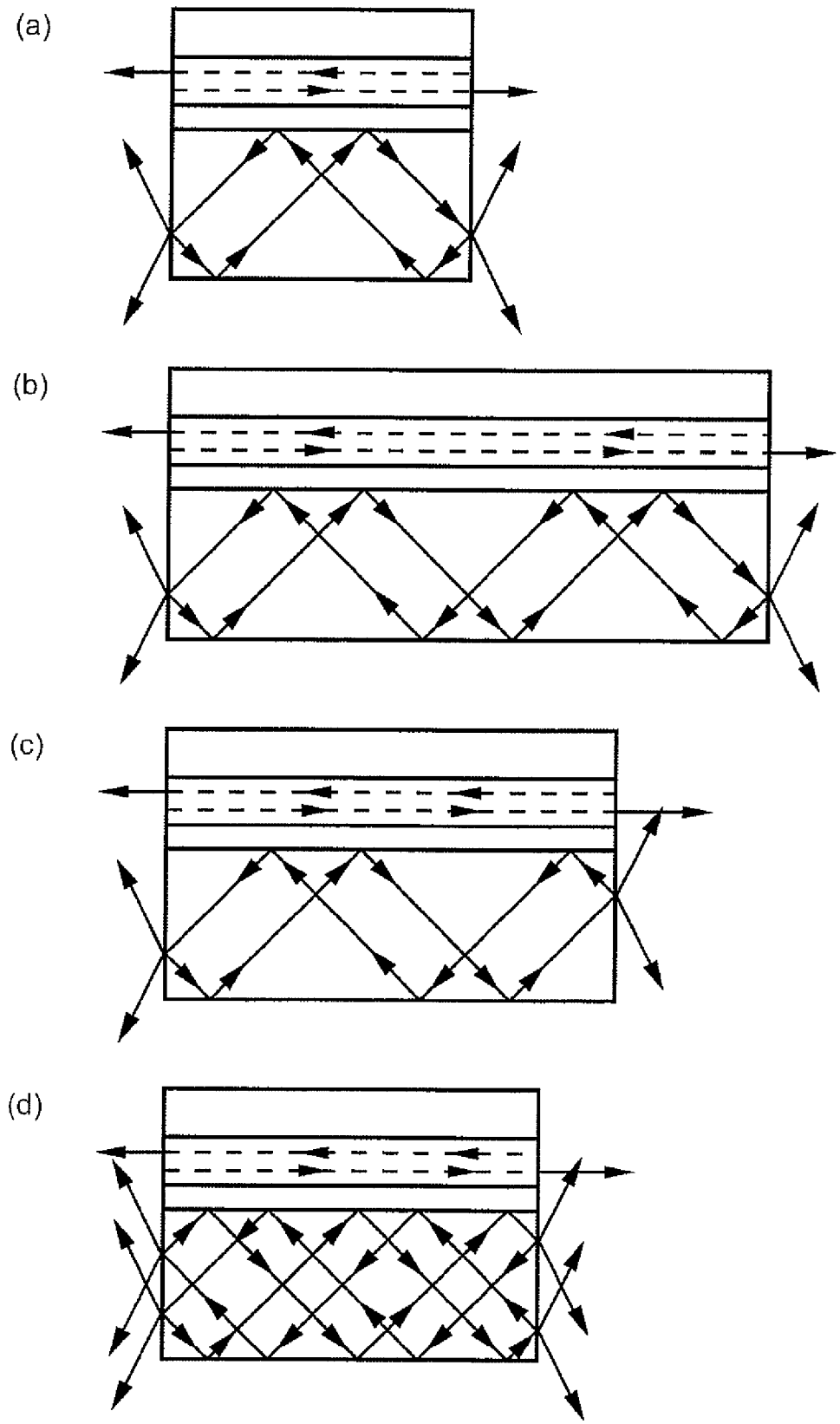
FIGS. 21(a) through 21(d) show schematically tilted wave lasers, wherein the tilted wave forms closed loops.

FIGS. 21(a) through 21(d) illustrates possible closed loops. FIG. 21(a) illustrates a closed loop formed if $L_{resonator} = L_{return}$. This implies that the tilted wave propagating in the broad waveguide impinges, on its double path forth and back along the waveguide, onto the cladding layer coupling two waveguides just twice.

FIG. 21(b) illustrates a closed loop formed if $L_{resonator} = 2L_{return}$. This implies that the tilted wave propagating in the broad waveguide impinges, on its double path forth and back along the waveguide, onto the cladding layer coupling two waveguides just four times.

FIG. 21(c) illustrates a closed loop formed if $$L_{resonator} = \frac{3}{2} L_{return}.$$

This implies that the tilted wave propagating in the broad waveguide impinges, on its double path forth and back along the waveguide, onto the cladding layer coupling two waveguides just three times.

FIG. 21(d) illustrates a closed loop formed if $$L_{resonator} = \frac{5}{4} L_{return}.$$

This implies that the tilted wave propagating in the broad waveguide impinges, on its four-fold path forth, back, forth and back along the waveguide, onto the cladding layer coupling two waveguides just five times.

Figure 22:
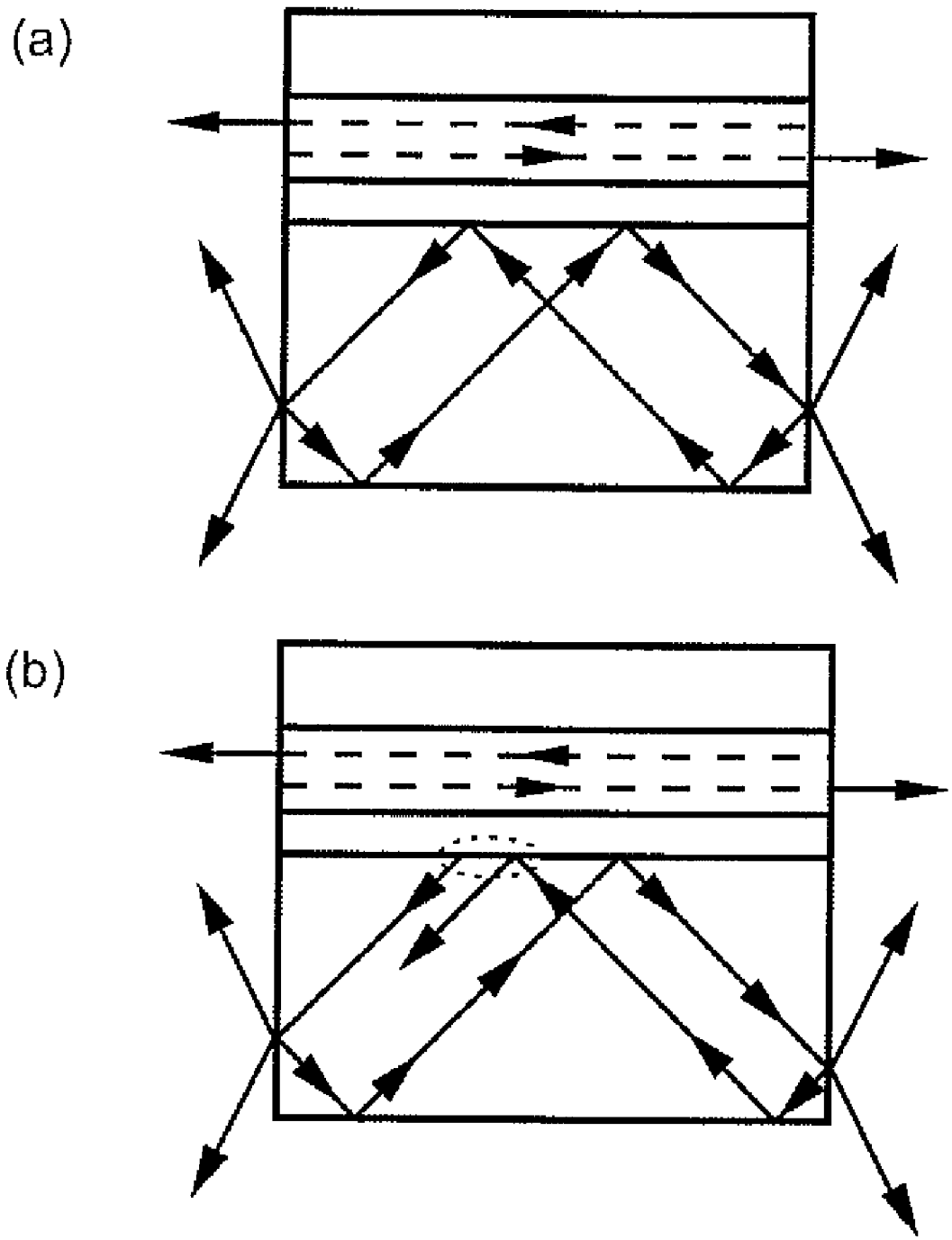
FIGS. 22(a) and (b) represent schematically comparison between a structure where the tilted wave in the broad waveguide forms a closed loop and a structure, where no closed loop is formed.
FIG. 22(b) refers to a structure, wherein the resonator length is slightly larger than the length of the return path of the tilted wave, and no closed loop is formed.
Figure 23:
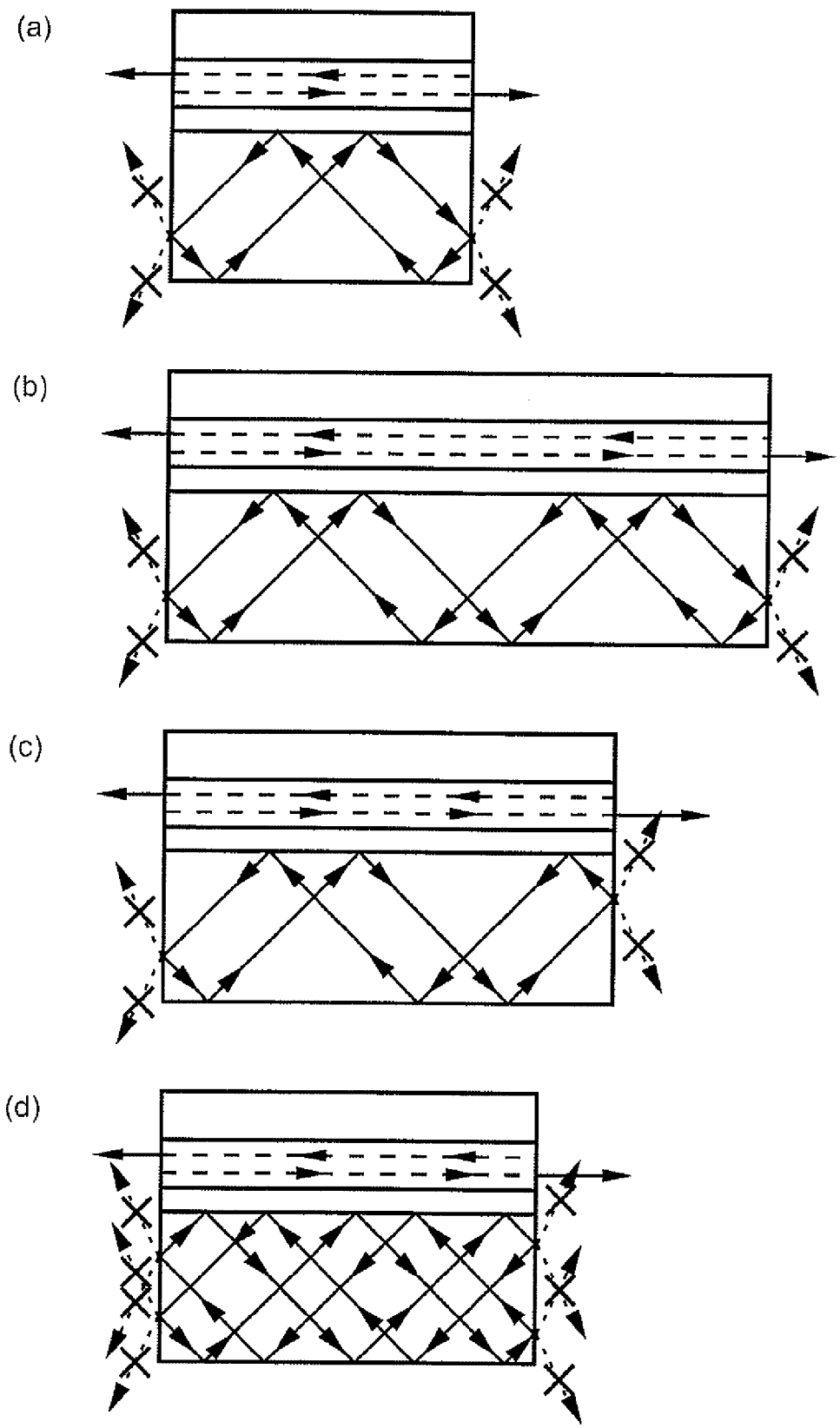
FIGS. 23(a) through (d) illustrate the formation of closed loops in the tilted wave laser, in which the leakage angle exceeds the angle of the total internal reflection at the facets.

FIGS. 22(a) and 22(b) illustrates a difference in the tilted paths of the tilted wave in a broad waveguide for a case, where a closed loop is formed (FIG. 22(a)), and a case, where a closed loop is not formed (FIG. 22(b)). FIG. 22(a) just repeats FIG. 21(a), for which $L_{resonator} = L_{return}$. FIG. 22(b) refers to a case, where $L_{resonator}$ is only slightly larger that $L_{return}$, and no closed loop is formed.

There exists a particular advantage of selecting a tilted wave laser with a preferred relationship between the resonator length and the length of the return path such that the tilted wave forms a closed loop. Once a narrow beam is targeted, a closed loop resonator allows obtaining the light emission, wherein the fraction of the output power concentrated in the two narrow lobes is enhanced with respect to a tilted wave laser with a long resonator, where no effects of the closed loops are incurred.

Another important advantage of selecting a tilted wave laser with a preferred relationship between the resonator length and the length of the return path resulting in the formation of a closed loop for the tilted wave is the enhancement of the wavelength selectivity.

FIGS. 23(a) through 23(d) illustrate formation of a closed loop for the propagation of a tilted wave in a broad waveguide, wherein the tilted wave exhibits the total internal reflection on the facets. This should only enhance effects of the closed loops as radiation losses at the facets are to a large extent eliminated. Thus, it is possible to significantly enhance the wavelength selectivity and thus improve wavelength-stabilized operation of the device.

Equations (16a) and (16b) can be extended over structure comprising unpumped sections. Then the active region in this section does not generate gain and operates just as an absorber. The set of equations describing the lasing threshold can be modified straightforwardly. To distinguish between pumped and unpumped sections it is convenient to introduce a pumping profile function $\theta_{pumping}(x)$, wherein $$\theta_{pumping}(x) = 1, \qquad \text{(Eq. 18a)}$$

if the device is pumped at the point x, and $$\theta_{pumping}(x) = 0, \qquad \text{(Eq. 18b)}$$

if the device is not pumped at the point x.

Then the equations (Eq. 16a) and (Eq. 16b) describing a change of the amplitude of a wave travelling along a narrow waveguide will be modified as follows, $$\frac{d}{dx}A^+(x) = \frac{\{g_{modal} \times \theta_{pumping}(x) - \alpha_{int} - \alpha_{active\ region}^{abs} \times [1 - \theta_{pumping}(x)]\}}{2} A^+(x) - \frac{\alpha_{leakage}}{2}\left[A^+(x) - \frac{p+iq}{2p}D^{+*}(x) - \frac{p-iq}{2p}D^+(x)\right], \qquad \text{(Eq. 19a)}$$

and $$-\frac{d}{dx}A^-(x) = \frac{\{g_{modal} \times \theta_{pumping}(x) - \alpha_{int} - \alpha_{active\ region}^{abs} \times [1 - \theta_{pumping}(x)]\}}{2} A^-(x) - \frac{\alpha_{leakage}}{2}\left[A^-(x) - \frac{p+iq}{2p}D^{-*}(x) - \frac{p-iq}{2p}D^-(x)\right]. \qquad \text{(Eq. 19b)}$$

Here $\alpha_{active\ region}^{abs}$ is the absorption of the active region in the unpumped section.

Solving the set of coupled equations (Eq. 14a) through (Eq. 14d), (Eq. 15a), (Eq. 15b), (Eq. 19a) and (Eq. 19b) as an eigenvalue and eigenvector matrix problem enables obtaining the threshold model gain and the longitudinal profile of the tilted optical wave at the lasing threshold.

Specific effects from unpumped sections can occur, if the unpumped sections form a periodic structures, and the period equals to the return path multiplied by a rational number, $$\frac{L_{period\ unpumped}}{L_{return}} = \frac{p}{q}, \quad \text{(Eq. 20)}$$

where both integer number p and integer number q are mutually prime numbers and do not exceed six.

A one skilled in the art will appreciate that the above described methods aimed at improving functionality of a semiconductor diode laser can also be applied to a superluminescent light emitting diode thus supporting desired and suppressing undesired optical modes.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

Although the invention has been illustrated and described with respect to exemplary embodiments thereof, it should be understood by those skilled in the art that the foregoing and various other changes, omissions and additions may be made therein and thereto, without departing from the spirit and scope of the present invention. Therefore, the present invention should not be understood as limited to the specific embodiments set out above but to include all possible embodiments which can be embodied within a scope encompassed and equivalents thereof with respect to the feature set out in the appended claims.

What is claimed is:

1. A semiconductor optoelectronic device, comprising:
   a) a vertical waveguide, comprising:
      i) a first cavity;
      ii) a first reflector located at a first side of the first cavity;
      iii) a second reflector located at a second side of the first cavity opposite to the first reflector;
      iv) at least one second cavity located at a side of the second reflector opposite to the first reflector; and
      v) at least one third reflector located at a side of the second cavity opposite to the first reflector;
   b) a light-generating element configured to generate optical gain when an injection current is injected to a light-generating layer when a forward bias is applied, wherein the light generating layer is located within the first cavity; and
   c) a substrate, where a relative positioning of the vertical waveguide and the substrate is selected from two alternatives:
      i) the second cavity is the substrate and the third reflector is a back surface of the substrate; and
      ii) the second cavity is a single layer or a multilayer epitaxial structure, the third reflector is a single layer or a multilayer epitaxial structure, and the substrate is located contiguous to the vertical waveguide; and
   d) an injector that injects the injection current to the light generating element, wherein light generated in the light generating element propagates in the first cavity and partially leaks to the second cavity through the second reflector; wherein the light leaked to the second cavity propagates in the second cavity, is reflected by the third reflector, propagates in the second cavity, and returns back to the first cavity through the second reflector; wherein interference between the light propagating in the first cavity and the light returning from the second cavity occurs; wherein phase matching conditions determine one selected vertical optical mode or a few selected vertical optical modes; wherein phase matching conditions determine one selected wavelength or a few selected wavelengths of the emitted light; wherein the vertical waveguide is a broad waveguide having a thickness exceeding three times a wavelength of light in a vacuum; wherein a major part of the optical power is emitted in the one or a few selected vertical optical modes; and wherein the major part is above about eighty per cent;
   e) a longitudinal resonator that confines the vertical waveguide in a longitudinal direction, the longitudinal resonator comprising:
      i) a front facet;
      ii) a rear facet distinct from the front facet; and
      iii) a resonator length defined as a distance between the front facet and the rear facet;
   f) at least one stripe that extends in the longitudinal direction; and
   g) an additional element selected from a group consisting of:
      i) an additional element of a first kind selected from a group consisting of:
         A) at least one groove that intersects the first cavity and the at least one stripe;
         B) a part of at least one facet cleaved at an angle other than a right angle with respect to a lateral plane; and
         C) any combination of A) and B), wherein the additional element of a first kind prevents light emission through the front facet from the first cavity;
      ii) an additional element of a second kind selected from a group consisting of:
         D) at least one groove that intersects the first cavity and does not intersect the at least one stripe;
         E) a rough surface of a side facet: and
         F) any combination of D) and E), wherein the additional element of a second kind suppresses parasitic modes of light emission;
      iii) an additional element of a third kind, wherein the additional element of a third kind is at least one unpumped section, wherein the additional element of a third kind suppresses light emission through the front facet from the first cavity;
      iv) an additional element of a fourth kind, wherein the additional element of a fourth kind is a coating, wherein the optical power reflectance of said coating as a function of the vertical angle at which light impinges on the front facet of the device is such that the coating provides distinct optical power reflectance for light impinging on the front facet of the device from the first cavity and for the light impinging on the front facet of the device from the second cavity, such that emission of light through the front facet from the second cavity is suppressed; and v) any combination of i) through iv), wherein the additional element improves a far field pattern of the emitted light.

2. The semiconductor optoelectronic device of claim 1, wherein the additional element is an additional element of a third kind, and the at least one unpumped section is located adjacent to at least one facet.

3. The semiconductor optoelectronic device of claim 1, wherein the additional element is an additional element of a third kind, and the at least one unpumped section is at least two unpumped sections.

4. The semiconductor optoelectronic device of claim 3, wherein the at least two unpumped sections form a periodic pattern.

5. The semiconductor optoelectronic device of claim 1, wherein the one selected vertical optical mode or one of the few selected vertical optical modes is a tilted vertical mode, and wherein light in the tilted optical mode impinges on the first facet and on the second facet at an angle exceeding an angle of the total internal reflectance at a semiconductor/air interface.

6. The semiconductor optoelectronic device of claim 1, selected from a group consisting of:
  a) a semiconductor light-emitting diode;
  b) a semiconductor superluminescent light-emitting diode;
  c) a semiconductor diode laser; and
  d) a gain chip.

7. A semiconductor optoelectronic device, comprising:
  a) a vertical waveguide, comprising:
    i) a first cavity;
    ii) a first reflector located at a first side of the first cavity;
    iii) a second reflector located at a second side of the first cavity opposite to the first reflector;
    iv) at least one second cavity located at a side of the second reflector opposite to the first reflector; and
    v) at least one third reflector located at a side of the second cavity opposite to the first reflector;
  b) a light-generating element configured to generate optical gain when an injection current is injected to a light-generating layer when a forward bias is applied, wherein the light generating layer is located within the first cavity;
  c) a substrate, where a relative positioning of the vertical waveguide and the substrate is selected from two alternatives:
    i) the second cavity is the substrate and the third reflector is a back surface of the substrate; and
    ii) the second cavity is a single layer or a multilayer epitaxial structure, the third reflector is a single layer or a multilayer epitaxial structure, and the substrate is located contiguous to the vertical waveguide; and
  d) an injector that injects the injection current to the light generating element, wherein light generated in the light generating element propagates in the first cavity and partially leaks to the second cavity through the second reflector; wherein the light leaked to the second cavity propagates in the second cavity, is reflected by the third reflector, propagates in the second cavity, and returns back to the first cavity through the second reflector; wherein interference between the light propagating in the first cavity and the light returning from the second cavity occurs; wherein phase matching conditions determine one selected vertical optical mode or a few selected vertical optical modes; wherein phase matching conditions determine one selected wavelength or a few selected wavelengths of the emitted light; wherein the vertical waveguide is a broad waveguide having a thickness exceeding three times a wavelength of light in a vacuum; wherein a major part of the optical power is emitted in the one or a few selected vertical optical modes; and wherein the major part is above about eighty per cent;
  e) a longitudinal resonator that confines the vertical waveguide in a longitudinal direction, the longitudinal resonator comprising:
    i) a front facet;
    ii) a rear facet distinct from the front facet; and
    id) a resonator length defined as a distance between the front facet and the rear facet;
  f) at least one stripe that extends in the longitudinal direction; and
  g) an additional element comprising a coating, wherein the optical power reflectance of the coating as a function of the vertical angle at which light impinges on the front facet of the device is such that the coating provides distinct optical power reflectance for light impinging on the front facet of the device from the first cavity and for the light impinging on the front facet of the device from the second cavity, such that emission of light through the front facet from the second cavity is suppressed.

8. The semiconductor optoelectronic device of claim 1, wherein the coating comprises an anti-reflective coating provided on the front facet.

9. The semiconductor optoelectronic device of claim 8, wherein the anti-reflective coating is configured such that it minimizes reflectivity for a specific angle of incidence of light impinging from the second cavity on the front facet.

10. A semiconductor optoelectronic device, comprising:
  a) a vertical waveguide, comprising:
    i) a first cavity;
    ii) a first reflector located at a first side of the first cavity;
    iii) a second reflector located at a second side of the first cavity opposite to the first reflector;
    iv) at least one second cavity located at a side of the second reflector opposite to the first reflector; and
    v) at least one third reflector located at a side of the second cavity opposite to the first reflector;
  b) a light-generating element configured to generate optical gain when an injection current is injected to a light-generating layer when a forward bias is applied, wherein the light generating layer is located within the first cavity;
  c) a substrate, where a relative positioning of the vertical waveguide and the substrate is selected from two alternatives:
    i) the second cavity is the substrate and the third reflector is a back surface of the substrate; and
    ii) the second cavity is a single layer or a multilayer epitaxial structure, the third reflector is a single layer or a multilayer epitaxial structure, and the substrate is located contiguous to the vertical waveguide; and
  d) an injector that injects the injection current to the light generating element, wherein light generated in the light generating element propagates in the first cavity and partially leaks to the second cavity through the second reflector; wherein the light leaked to the second cavity propagates in the second cavity, is reflected by the third reflector, propagates in the second cavity, and returns back to the first cavity through the second reflector; wherein interference between the light propagating in the first cavity and the light returning from the second cavity occurs; wherein phase matching conditions determine one selected vertical optical mode or a few selected vertical optical modes; wherein phase matching conditions determine one selected wavelength or a few selected wavelengths of the emitted light; wherein the vertical waveguide is a broad waveguide having a thickness exceeding three times a wavelength of light in a vacuum; wherein a major part of the optical power is emitted in the one or a few selected vertical optical modes; and wherein the major part is above about eighty per cent;

e) a longitudinal resonator that confines the vertical waveguide in a longitudinal direction, the longitudinal resonator comprising:
   i) a front facet;
   ii) a rear facet distinct from the front facet; and
   iii) a resonator length defined as a distance between the front facet and the rear facet;

f) at least one stripe that extends in the longitudinal direction; and g) an additional element comprising at least one groove that intersects the first cavity and the at least one stripe, wherein the additional element prevents light emission through the front facet from the first cavity.

11. The semiconductor optoelectronic device of claim 10, wherein the at least one groove comprises two grooves that intersect the first cavity and the at least one stripe.

12. The semiconductor optoelectronic device of claim 10, wherein the at least one groove comprises a v-groove in cross-section with respect to a vertical longitudinal plane.

13. The semiconductor optoelectronic device of claim 12, wherein the v-groove is tilted with respect to a direction extending perpendicular to the at least one stripe.

14. A semiconductor optoelectronic device, comprising:
a) a vertical waveguide, comprising:
   i) a first cavity;
   ii) a first reflector located at a first side of the first cavity;
   iii) a second reflector located at a second side of the first cavity opposite to the first reflector;
   iv) at least one second cavity located at a side of the second reflector opposite to the first reflector; and
   v) at least one third reflector located at a side of the second cavity opposite to the first reflector;
b) a light-generating element configured to generate optical gain when an injection current is injected to a light-generating layer when a forward bias is applied, wherein the light generating layer is located within the first cavity;
c) a substrate, where a relative positioning of the vertical waveguide and the substrate is selected from two alternatives:
   i) the second cavity is the substrate and the third reflector is a back surface of the substrate; and
   ii) the second cavity is a single layer or a multilayer epitaxial structure, the third reflector is a single layer or a multilayer epitaxial structure, and the substrate is located contiguous to the vertical waveguide; and
d) an injector that injects the injection current to the light generating element, wherein light generated in the light generating element propagates in the first cavity and partially leaks to the second cavity through the second reflector; wherein the light leaked to the second cavity propagates in the second cavity, is reflected by the third reflector, propagates in the second cavity, and returns back to the first cavity through the second reflector; wherein interference between the light propagating in the first cavity and the light returning from the second cavity occurs; wherein phase matching conditions determine one selected vertical optical mode or a few selected vertical optical modes; wherein phase matching conditions determine one selected wavelength or a few selected wavelengths of the emitted light; wherein the vertical waveguide is a broad waveguide having a thickness exceeding three times a wavelength of light in a vacuum; wherein a major part of the optical power is emitted in the one or a few selected vertical optical modes; and wherein the major part is above about eighty per cent;

e) a longitudinal resonator that confines the vertical waveguide in a longitudinal direction, the longitudinal resonator comprising:
   i) a front facet;
   ii) a rear facet distinct from the front facet; and
   iii) a resonator length defined as a distance between the front facet and the rear facet;

f) at least one stripe that extends in the longitudinal direction; and g) an additional element comprising at least one groove that intersects the first cavity and does not intersect the at least one stripe, wherein the additional element suppresses parasitic modes of light emission.

15. The semiconductor optoelectronic device of claim 14, wherein the at least one groove comprises two grooves.

16. The semiconductor optoelectronic device of claim 15, wherein the two grooves extend parallel to the at least one stripe.

17. New The semiconductor optoelectronic device of claim 16, wherein the two grooves each comprise a v-groove in cross-section with respect to a vertical lateral plane.

* * * * *